United States Patent [19]

Takeda et al.

[11] Patent Number: 6,041,082
[45] Date of Patent: Mar. 21, 2000

[54] DIGITAL AMPLITUDE MODULATION AMPLIFIER AND TELEVISION BROADCASTING MACHINE

[75] Inventors: Haruo Takeda; Yukio Tatsumi; Ikuji Fujitani; Takuya Shioda; Tomofumi Yoshimi; Tomohiko Sugimoto; Kazuhisa Haeiwa, all of Tokyo, Japan

[73] Assignees: NEC Corporation; Nippon Hoso Kyokai, both of Japan

[21] Appl. No.: 08/923,323

[22] Filed: Sep. 4, 1997

[30] Foreign Application Priority Data

Sep. 6, 1996 [JP] Japan .................................. 8-257666
Sep. 6, 1996 [JP] Japan .................................. 8-257667

[51] Int. Cl.[7] ............................................... H03C 1/52
[52] U.S. Cl. ......................... 375/300; 330/10; 329/149; 455/108
[58] Field of Search .................................. 375/295, 300, 375/268; 330/10; 329/149; 455/91, 108

[56] References Cited

U.S. PATENT DOCUMENTS

| | | | |
|---|---|---|---|
| 4,403,197 | 9/1983 | Swanson | 330/10 |
| 4,804,931 | 2/1989 | Hulick | 332/31 |
| 5,111,158 | 5/1992 | Malec et al. | 330/297 |
| 5,132,637 | 7/1992 | Swanson | 330/10 |
| 5,450,444 | 9/1995 | Miki et al. | 375/295 |
| 5,578,971 | 11/1996 | Minami et al. | 332/149 |

FOREIGN PATENT DOCUMENTS

| | | |
|---|---|---|
| 63-15589 | 1/1988 | Japan . |
| 5308584 | 11/1993 | Japan . |
| 7226635 | 8/1995 | Japan . |
| 7326951 | 12/1995 | Japan . |
| 3028486 | 3/1996 | Japan . |
| 8204456 | 6/1996 | Japan . |
| 9200273 | 7/1997 | Japan . |

OTHER PUBLICATIONS

Office Action Issued by the Japanese Patent Office on Mar. 16, 1999 in the Corresponding Japanese Application and an English Translation Thereof.
Office Action Issued by the Japanese Patent Office on Apr. 6, 1999 in the Corresponding Japanese Application and an English Translation Thereof.

Primary Examiner—Chi H. Pham
Assistant Examiner—Bryan Webster
Attorney, Agent, or Firm—Ostrolenk, Faber, Gerb & Soffen, LLP

[57] ABSTRACT

Since output voltage e of coupler CU2 is displaced in phase by −135 degrees from input signals c and d (by −270 degrees from signals a and b), a carrier which makes signal f is phase shifted by −270 degrees by phase shifter φ1 so that signal f may have the same phase as signal e. Signal f and signal e are power composed by first 3 dB coupler M1, and are further phase shift controlled by variable phase shifters PH11 and PH12 so that they may have the same phase. Further, an output signal of variable phase shifter PH11 is phase shifted by −90 degrees by phase shifter SH1 so that it has a phase difference by 90 degrees from an output signal of variable phase shifter PH2, and the two signals controlled in this manner are inputted to 3 dB coupler M2. Consequently, two signals e and f inputted to the amplifier are all outputted as output voltage EOUT. According to the present invention of a television broadcasting machine, since a carrier is phase modulated and amplitude modulated with amplitude information and phase information obtained from an input video signal, a vestigial side band signal is outputted to form a television signal without using vestigial side band.

15 Claims, 22 Drawing Sheets

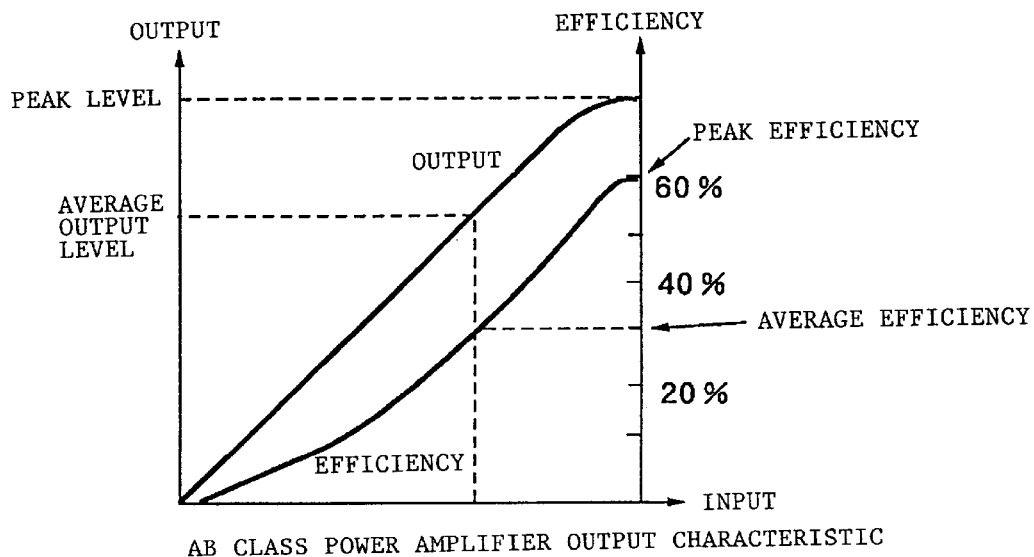
Fig. 5 (A) (Prior Art)
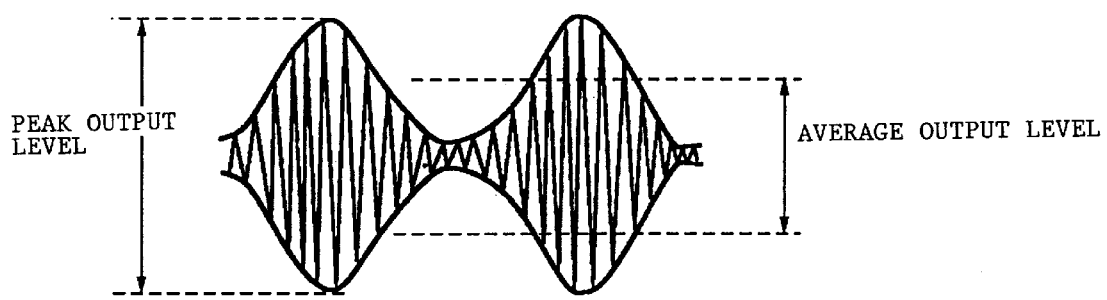
Fig. 5 (B) (Prior Art)

Fig. 10

| INPUT POWER RATIO | PHASE DIFFERENCE BETWEEN g - h | PHASE SHIFT CONTROL AMOUNT | | PHASE DIFFERENCE BETWEEN i - k |
|---|---|---|---|---|
| | | PH11 | PH12 | |
| $1 > \dfrac{\text{POWER E}}{\text{POWER F}} \geq 0.5278$ | 0° ~ 18° | 0° | 0° | 90° +(0° ~18°) |
| $0.5278 > \dfrac{\text{POWER E}}{\text{POWER F}} \geq 0.2596$ | 18° ~ 36° | -9° | +9° | 90° +(0° ~18°) |
| $0.2596 > \dfrac{\text{POWER E}}{\text{POWER F}} \geq 0.1056$ | 36° ~ 54° | -18° | +18° | 90° +(0° ~18°) |
| $0.1056 > \dfrac{\text{POWER E}}{\text{POWER F}} \geq 0.0251$ | 54° ~ 72° | -27° | +27° | 90° +(0° ~18°) |
| $0.0251 > \dfrac{\text{POWER E}}{\text{POWER F}} \geq 0$ | 72° ~ 90° | -36° | +36° | 90° +(0° ~18°) |
| (∞) WHEN POWER F = 0 (SELF BIT, OFF) | -90° | +36° | -36° | 90° - 18° |

Fig. 12

| ON/OFF | | | | POWER RATIO | | | PH31 | PH32 | POWER RATIO | | | PH21 | PH22 | POWER RATIO | | | PH11 | PH12 |
|---|---|---|---|---|---|---|---|---|---|---|---|---|---|---|---|---|---|---|
| PA1 | PA2 | PA3 | PA4 | A | B | A/B | | | C | D | C/D | | | E | F | E/F | | |
| 0 | 0 | 0 | 1 | 1 | 0 | ∞ | +36° | -36° | 1 | 0 | ∞ | +36° | -36° | 1 | 0 | ∞ | +36° | -36° |
| 0 | 0 | 1 | 0 | 0 | 2 | 0 | -36° | +36° | 2 | 0 | ∞ | +36° | -36° | 2 | 0 | ∞ | +36° | -36° |
| 0 | 0 | 1 | 1 | 1 | 2 | 0.5 | -9° | +9° | 3 | 0 | ∞ | +36° | -36° | 3 | 0 | ∞ | +36° | -36° |
| 0 | 1 | 0 | 0 | 0 | 0 | ∞ | +36° | -36° | 0 | 4 | 0 | -36° | +36° | 4 | 0 | ∞ | +36° | -36° |
| 0 | 1 | 0 | 1 | 1 | 0 | ∞ | +36° | -36° | 1 | 4 | 0.25 | -18° | +18° | 5 | 0 | ∞ | +36° | -36° |
| 0 | 1 | 1 | 0 | 0 | 2 | 0 | -36° | +36° | 2 | 4 | 0.5 | -9° | +9° | 6 | 0 | ∞ | +36° | -36° |
| 0 | 1 | 1 | 1 | 1 | 2 | 0.5 | -9° | +9° | 3 | 4 | 0.75 | 0° | 0° | 7 | 0 | ∞ | +36° | -36° |
| 1 | 0 | 0 | 0 | 0 | 0 | ∞ | +36° | -36° | 0 | 0 | ∞ | +36° | -36° | 0 | 8 | 0 | -36° | +36° |
| 1 | 0 | 0 | 1 | 1 | 0 | ∞ | +36° | -36° | 1 | 0 | ∞ | +36° | -36° | 1 | 8 | 0.125 | -18° | +18° |
| 1 | 0 | 1 | 0 | 0 | 2 | 0 | -36° | +36° | 2 | 0 | ∞ | +36° | -36° | 2 | 8 | 0.25 | -18° | +18° |
| 1 | 0 | 1 | 1 | 1 | 2 | 0.5 | -9° | +9° | 3 | 0 | ∞ | +36° | -36° | 3 | 8 | 0.375 | -9° | +9° |
| 1 | 1 | 0 | 0 | 0 | 0 | ∞ | +36° | -36° | 0 | 4 | 0 | -36° | +36° | 4 | 8 | 0.5 | -9° | +9° |
| 1 | 1 | 0 | 1 | 1 | 0 | ∞ | +36° | -36° | 1 | 4 | 0.25 | -18° | +18° | 5 | 8 | 0.625 | 0° | 0° |
| 1 | 1 | 1 | 0 | 0 | 2 | 0 | -36° | +36° | 2 | 4 | 0.5 | -9° | +9° | 6 | 8 | 0.75 | 0° | 0° |
| 1 | 1 | 1 | 1 | 1 | 2 | 0.5 | -9° | +9° | 3 | 4 | 0.75 | 0° | 0° | 7 | 8 | 0.875 | 0° | 0° |

Fig. 13

| ON/OFF | | | | INPUT LEVEL | PIN (dB) | POUT (dB) | LOSS (dB) |
| --- | --- | --- | --- | --- | --- | --- | --- |
| PA1 | PA2 | PA3 | PA4 | | | | |
| 0 | 0 | 0 | 1 | 1 | 0 | −0.11 | 0.11 |
| 0 | 0 | 1 | 0 | 2 | 3.01 | 2.81 | 0.20 |
| 0 | 0 | 1 | 1 | 3 | 4.77 | 4.62 | 0.15 |
| 0 | 1 | 0 | 0 | 4 | 6.02 | 5.86 | 0.16 |
| 0 | 1 | 0 | 1 | 5 | 6.99 | 6.89 | 0.10 |
| 0 | 1 | 1 | 0 | 6 | 7.78 | 7.65 | 0.13 |
| 0 | 1 | 1 | 1 | 7 | 8.45 | 8.31 | 0.14 |
| 1 | 0 | 0 | 0 | 8 | 9.03 | 8.94 | 0.09 |
| 1 | 0 | 0 | 1 | 9 | 9.54 | 9.43 | 0.11 |
| 1 | 0 | 1 | 0 | 10 | 10.00 | 9.95 | 0.05 |
| 1 | 0 | 1 | 1 | 11 | 10.41 | 10.34 | 0.07 |
| 1 | 1 | 0 | 0 | 12 | 10.79 | 10.74 | 0.05 |
| 1 | 1 | 0 | 1 | 13 | 11.14 | 11.04 | 0.10 |
| 1 | 1 | 1 | 0 | 14 | 11.46 | 11.39 | 0.07 |
| 1 | 1 | 1 | 1 | 15 | 11.76 | 11.71 | 0.05 |

DIGITAL AMPLITUDE MODULATION AMPLIFIER AND TELEVISION BROADCASTING MACHINE

BACKGROUND OF THE INVENTION

1. Field of the Invention

This invention relates to a digital amplitude modulation amplifier, and more particularly to a digital amplitude modulation amplifier which converts a modulation signal into a digital signal, power amplifies a transmission carrier in accordance with the digital signal and outputs an amplitude modulated wave.

The present invention relates also to a television broadcasting machine, and more particularly to a television broadcasting machine which can transmit a vestigial side band modulated (VSB) television broadcasting signal by phase modulating and amplitude modulating a carrier with phase information and amplitude information obtained from a video signal.

2. Description of the Related Art

FIG. 1 shows a block diagram of an example of a conventional amplitude modulation amplifier. Referring to FIG. 1, a carrier outputted from carrier generator 11 and a modulation signal outputted from modulation signal generator 12 are supplied to amplitude modulator 41, by which an amplitude modulated wave is produced by modulating the amplitude of the carrier with the modulation signal. The amplitude modulated wave is supplied to and power amplified by linear power amplifier 42 which performs an A class or AB class operation. Consequently, the carrier (amplitude modulated wave) whose amplitude is modulated in accordance with the modulation signal is outputted from linear power amplifier 42.

FIG. 2 shows a block diagram of an example of a conventional digital amplitude modulation amplifier. This conventional digital amplitude modulation amplifier is disclosed in U.S. Pat. No. 4,804,931 and can control the output level thereof with a digital signal in the form of a modulation signal.

Referring to FIG. 2, an analog modulation signal generated from modulation signal generator 12 is supplied to A/D converter 13, by which it is converted into a digital modulation signal. The digital modulation signal is supplied to on/off controller 14, by which it is converted into a control signal for on/off switching four switches SW1 to SW4. Here, since four switches SW1 to SW4 are involved, the quantization bit number of the output digital signal of A/D converter 13 described above is 4 bits, and the control signal mentioned above on/off switches switches SW1 to SW4 corresponding to the individual bits.

Switches SW1 to SW4 receive a carrier generated by carrier generator 11 as input signals thereto and supply the inputted carriers to power amplifiers PA1 to PA4 provided corresponding thereto for periods for which they are controlled to an on state. Since a linear characteristic is not required for power amplifiers PA1 to PA4, they are constructed so as to effect a C class operation in which they exhibit a high power utilization efficiency. Further, power amplifiers PA1 to PA4 have amplification degrees weighted for the individual bits of the digital signal of 4 bits. For example, power amplifier PA1 has an amplification degree which increases in proportion to $2^3$ corresponding to the most significant bit (MSB) of the 4-bit digital signal, and similarly, power amplifiers PA2, PA3 and PA4 have amplification degrees which increase in proportion to $2^2$, $2^1$ and $2^0$, respectively.

An output signal of each of power amplifiers PA1 to PA4 is inputted to the one of the two input signals of the corresponding one of the 3 dB couplers CO1 to CO4 provided corresponding to power amplifiers PA1 to PA4 and is coupled to another input signal to the other input terminal. Here, output signals of the 3 dB couplers CO2, CO3 and CO4 of the preceding bits (lower bits) are inputted to the other input terminals of the 3 dB couplers CO1, CO2 and CO3. Further, the carrier from carrier generator 11 amplified by initial signal amplifier 19 is inputted to the other input terminal of the 3 dB coupler CO4 of the least significant bit (LSB). It is to be noted that dummy resistors R1 or R4 are connected to dummy outputs of 3 dB couplers CO0 to CO4, respectively.

3 dB couplers CO1 to CO4 have the same construction, and as a representative of them, the construction of coupler CO1 is shown in FIG. 3. Referring to FIG. 3, coupler CO1 has input terminal 51 to which an output signal of coupler CO2 of the lower bit is inputted, input terminal 52 to which an output signal of power amplifier PA1 of the self bit is inputted, output terminal 53 from which a coupling output signal is outputted, and dummy output terminal 54.

Since the output signal of coupler CO2 of the lower bit is a coupling output signal of 3 dB couplers CO4, CO3 and CO2 (in other words, a composite signal of the output signals of power amplifiers PA4, PA3 and PA2 in accordance with on/off states of switches SW4, SW3 and SW2), as can be seen from the construction of FIG. 3, an output signal composed in accordance with on/off states of switches SW1 to SW4 from among the output signals of power amplifiers PA1 to PA4 is outputted from output terminal 53 of 3 dB coupler CO1. In particular, the output signal of 3 dB coupler CO1 in this instance is an amplitude modulated wave varied in accordance with on/off states of switches SW1 to SW4 and having an amplitude modulated in accordance with the modulation signal. FIG. 4 is a diagrammatic view of a concept of composition of the amplitude modulated wave, and reference symbols pa1 to pa4 denote output signal components of power amplifiers PA1 to PA4 of the output amplitude modulated wave.

The conventional amplitude modulation amplifier shown in FIG. 1, however, has a problem in that the power utilization efficiency is low because an amplitude modulated signal is power amplified by linear power amplifier 42 which effects an A class or AB class operation. This is described with reference to FIGS. 5(A) and 5(B). An amplitude modulated wave exhibits a large difference between a peak level and an average level of the signal as seen from FIG. 5(B). In order to amplify an amplitude modulated wave having such character as just described with minimized distortion, a linear power amplifier which effects an A class or AB class operation is used, and the efficiency of the power amplifier of the type just mentioned drops in accordance with a drop of the output level as seen from FIG. 5(A). Therefore, the efficiency at an average output level exhibits a value lower than a peak efficiency.

Meanwhile, the conventional digital amplitude modulation amplifier shown in FIG. 2 has such problems as described below since it employs 3 dB couplers CO1 to CO4. In particular, if voltage E1 inputted to input terminal 51 and voltage E2 inputted to input terminal 52 in FIG. 3 have a relationship such that the phases thereof may be 0 degree and 90 degrees, respectively, output voltage EOUT of output terminal 53 and dummy voltage EDUM of dummy output terminal 54 have a relationship such as the ones represented by the following expressions:

$$E_{OUT} = \frac{E_1}{\sqrt{2}}\angle 0° + \frac{E_2}{\sqrt{2}}\angle(90° - 90°) = \frac{E_1}{\sqrt{2}}\angle 0° + \frac{E_2}{\sqrt{2}}\angle 0°$$

$$E_{DUM} \frac{E_1}{\sqrt{2}}\angle(0° - 90°) + \frac{E_2}{\sqrt{2}}\angle 90° = \frac{E_1}{\sqrt{2}}\angle - 90° + \frac{E_2}{\sqrt{2}}\angle 90°$$

According to the expressions above, when E1=E2, dummy voltage EDUM to dummy output terminal 54 is 0, and the input voltages are all led out to output terminal 53. However, input voltage E1 to input terminal 51 is a composite output signal of power amplifiers PA2 to PA4 of the lower bits and varies in accordance with on/off states of switches SW2 to SW4 on the input sides of power amplifiers PA2 to PA4 (that is, the values of the 2 to 4 bits of the digital signal). Also input signal E2 to input terminal 52 varies between presence and absence depending upon the state of its corresponding bit.

Accordingly, depending upon the on/off states of switches SW1 to SW4 on the input sides of power amplifiers PA1 to PA4 (that is, the values of the bits of the digital signal), all of the signal power inputted to 3 dB coupler CO1 is not led out to output terminal 53, but part of the signal power is absorbed from dummy output terminal 54 by dummy resistor R1, resulting in drop of the power utilization efficiency. Also the modulation degree of the output signal from output terminal 53 does not exhibit regeneration of the amplitude of the input modulation degree with fidelity.

Meanwhile, a conventional television broadcasting machine includes, for example, as shown in a block diagram of FIG. 6, input terminal 101 for receiving an analog video signal, signal invertor 103, amplitude modulator 150, carrier generator 151, vestigial side band filter (VSBF) 152, power amplifier 153 and output terminal 117.

Operation of the conventional television broadcasting machine is described below. An analog video signal inputted through input terminal 101 is inverted by signal invertor 103 and then inputted as a modulation signal to amplitude modulator 150, by which a carrier from carrier generator 151 is amplitude modulated with the modulation signal to form an amplitude modulated wave. Since the amplitude modulated wave is a double side band (DSB) signal, it is supplied to vestigial side band filter (VSBF) 152, by which most of a lower side band is removed therefrom to form a vestigial side band (VSB) signal. Then, the vestigial side band signal is power amplified by power amplifier 153 and outputted to output terminal 117 so that it may be multiplexed and transmitted with an audio modulated wave.

However, since the conventional television broadcasting machine requires vestigial side band filter 152 irrespective of whether it is of a lower power stage or a high power stage and vestigial side band filter 152 is a part so important that it decides a characteristic of the entire broadcasting machine and is required to be formed with a particularly high degree of accuracy, it has a problem in that vestigial side band filter 152 is a special filter and is expensive.

SUMMARY OF THE INVENTION

The present invention has been made in view of the foregoing, and it is an object of the present invention to provide a digital amplitude modulation amplifier which can produce an amplitude modulated signal efficiently.

It is another object of the present invention to provide a digital amplitude modulation amplifier which can output an amplitude modulated wave which regenerates the amplitude of an input modulation degree with a higher degree of fidelity.

Further, the present invention has been made in view of the situations described above, and it is a further object of the present invention to provide a television broadcasting machine which can transmit a vestigial side band modulated television signal without using a vestigial side band filter.

In order to attain the object described above, according to as aspect of the present invention, there is provided a digital amplitude modulation amplifier, comprising an A/D converter for converting an analog modulation signal into a digital signal of a predetermined quantization bit number, a plural number of power amplifiers equal to the quantization bit number of the digital signal for C class operating with amplification degrees weighted for the individual bits, selectively inputting means for selectively inputting a carrier to the plural number of power amplifiers in accordance with values of the individual bits of the digital signal, coupling means for power composing, for all bits, output signals of those of the plural number of power amplifiers which are allocated to lower bits and output signals of those of the plural number of power amplifiers which are allocated to the other upper bits while controlling the phases of both of the output signals based on an external input phase control signal, further power composing, for all of the bits, the power composed signals while controlling the phases of the power composed signals based on the output signals of those of the power amplifiers which are allocated to the upper bits and the external input phase control signal and outputting a phase modulated wave from the last stage, and phase controlling means for receiving the digital signal as an input signal and generating and supplying the external input phase control signal to the coupling means.

In the aspect of the present invention described, since the coupling means power composes output signals of the plural number of power amplifiers which are allocated to lower bits and output signals of the plural number of power amplifiers which are allocated to the other upper bits while controlling the phases of both of the output signals based on an external input phase control signal, an output signal of one of the plural number of power amplifiers and an output signal of another one of the plural number of power amplifiers or a power composed signal of output signals of another two of the plural number of power amplifiers on the lower bit side of the one power amplifier, which are inputted to the coupling means, can be composed efficiently and outputted, and a power loss which is absorbed by dummy loads of the coupling means can be substantially eliminated.

According to another aspect of the present invention, the digital amplitude modulation amplifier described above further comprises a D/A converter for converting, from within the digital signal divided into predetermined lower bits and upper bits in advance, the digital signal of the lower bits into an analog signal, an amplitude modulator for amplitude modulating the carrier with the output analog signal of the D/A converter, and a single A class or AB class power amplifier provided in place of the one, or two or more of the plural number of power amplifiers which are allocated to the lower bits, and an output signal of the A class or AB class power amplifier is inputted to the coupling means while the digital signal of the upper bits is inputted to the selective inputting means.

In the aspect of the present invention described, while the power amplifiers which are provided corresponding to the upper bits of the digital signal and effect a C class operation are used for the upper bits of the digital signal, the single A class or AB class power amplifier can be used commonly for the lower bits of the digital signal.

Further, since, in the aspect of the present invention, a carrier phase modulated with a desired information signal can be used for the input carrier, a modulated wave which includes both of amplitude information and phase information can be outputted.

Further, in order to attain the object described above, according to a further aspect of the present invention, there is provided a television broadcasting machine, comprising information production means for producing first information and second information which are perpendicular to each other from an input analog video signal using first and second filters, polar coordinate transformation means for polar coordinate transforming the first information and second information to extract amplitude information and phase information of a vestigial side band modulation system, phase modulation means for phase modulating a carrier with the phase information, a power amplifier for power amplifying an output phase modulated wave of the phase modulation means, and amplitude controlling means for controlling an output level of the power amplifier in accordance with the amplitude information, the power amplifier outputting a vestigial side band signal to form a television signal.

Next, operation of the present invention is described. A vestigial side band (VSB) signal is used for television broadcasting. Since the VSB signal includes a double side band (DSB) part and a single side band (SSB) part, a modulated wave is subject to phase modulation simultaneously to amplitude modulation. This is described using numerical expressions. Where angular frequencies of base bands corresponding to the DSB part and the SSB part of a VSB signal are represented by $\omega_D$ and $\omega_S$, respectively, an input video signal including a dc component is represented by $$1 + k \cdot \cos \omega_D t + k \cdot \cos \omega_S t$$

where k is the modulation degree and is given by Vm/Vc where Vc is the amplitude of the carrier and Vm is the amplitude of the modulation signal.

If carrier $Vc \cdot \cos \omega_C t$ is amplitude modulated with the video signal given above, then the following expression is obtained:

$$\begin{aligned} v_{DSB} &= (1 + k \cdot \cos \omega_D t + k \cdot \cos \omega_S t) \cdot Vc \cdot \cos \omega_C t \\ &= Vc \cdot \cos \omega_C t + (1/2) Vc \{ k \cos(\omega_C + \omega_D) t + \\ &\quad k \cos(\omega_C - \omega_D) t + k \cos(\omega_C + \omega_S) t + k \cos(\omega_C - \omega_S) t \} \end{aligned}$$

Conventionally, a VSB signal is obtained by removing the term of lower side wave $k \cdot \cos(\omega_C - \omega_S) t$ in the expression above using a vestigial side band filter. The following expression is obtained by transforming the VSB signal:

$$\begin{aligned} v_{VSB} &= Vc \cdot \cos \omega_C t + (1/2) Vc \{ k \cos(\omega_C + \omega_D) t + \\ &\quad k \cos(\omega_C - \omega_D) t + k \cos(\omega_C + \omega_D) t \} \\ &= Vc \left[ \left\{ 1 + \frac{1}{2} (2k \cos \omega_D t + k \cos \omega_S t) \right\} \cos \omega_C t - \\ &\quad \frac{1}{2} k \sin \omega_S t \sin \omega_C t \right] \\ &= A(t) \cdot Vc \cdot \cos(\omega_C t + \theta(t)) \end{aligned} \quad (2)$$

where $$A(t) = \sqrt{\left\{ 1 + \frac{1}{2}(2k\cos\omega_D t + k\cos\omega_S t) \right\}^2 + \left(\frac{1}{2}k\sin\omega_S t\right)^2}$$

$$\theta(t) = \tan^{-1}\left\{ \frac{\frac{1}{2}k\sin\omega_S t}{1 + \frac{1}{2}(2k\cos\omega_D t + k\cos\omega_S t)} \right\}$$

In this manner, the VSB signal is in the form of a signal wherein carrier $Vc \cdot \cos \omega_C t$ is modulated with amplitude information A(t) and phase information θ(t).

Therefore, in the present invention, first information (that is, real axis components (I information: $1 + k \cdot \cos \omega_D t + (\frac{1}{2}) k \cdot \cos \omega_S t$)) and second information (that is, imaginary axis components (Q information: $(\frac{1}{2}) k \cdot \sin \omega_S t$)), which are in a perpendicular relationship to each other, are produced by the information production means using the first filter which has a characteristic that it passes therethrough signal components of a band which makes the DSB part of an input analog video signal ($1 + k \cdot \cos \omega_D t + k \cdot \cos \omega_S t$) and limits the amplitude of signal components of another band which makes the SSB part to ½ time and the second filter which has another characteristic that it passes therethrough only signal components of a band which makes the SSB part of a VSB signal with an amplitude equal to ½ that of the input thereto and the phase of the output signal thereof is displaced by 90 degrees.

Then, the first information and the second information (real axis components and imaginary axis components) are transformed into polar coordinates by the polar coordinate transformation means thereby to obtain amplitude information and phase information. They can be represented by the following expressions:

Amplitude information: $A(t) =$ $$\sqrt{I^2 + Q^2} = \sqrt{\left(1 + k\cos\omega_D t + \frac{1}{2}k\cos\omega_S t\right)^2 + \left(\frac{1}{2}k\sin\omega_S t\right)^2}$$

Phase information: $\theta(t) = \tan^{-1}\frac{Q}{I} = \dfrac{\frac{1}{2}k\sin\omega_S t}{1 + k\cos\omega_D t + \frac{1}{2}k\cos\omega_S t}$ Carrier $Vc \cdot \cos \omega_C t$ is phase modulated with this phase information θ(t) by the phase modulation means, and an output phase modulated wave of the phase modulation means is supplied to the power amplifier. The output level of the power amplifier is controlled in accordance with amplitude information A(t) by the amplitude controlling means. Consequently, VSB signal $v_{VSB}$ given by the following expression:

$$v_{VSB} = A(t) \cdot Vc \cdot \cos(\omega_C t + \theta(t))$$

is obtained. This expression is the same as the expression (2) above.

BRIEF DESCRIPTION OF THE DRAWINGS

FIGS. 5(A) and 5(B) are a characteristic diagram and a waveform diagram of an amplitude modulated wave, respectively, illustrating a subject of the conventional amplitude modulation amplifier of FIG. 1;

FIG. 10 is a view illustrating input power ratios, phase differences of signals at different locations and control phase shift amounts of the coupler of FIG. 8;

FIG. 12 is a view showing a table indicating relationships between digital signals and phase shift amounts of the phase shifters shown in FIG. 7;

FIG. 13 is a view showing a table indicating relationships of input and output powers and losses to digital signals in FIG. 7;

DETAILED DESCRIPTION OF THE PREFERRED EMBODIMENTS

Embodiments of the present invention are described below with reference to the drawings.

Figure 1:
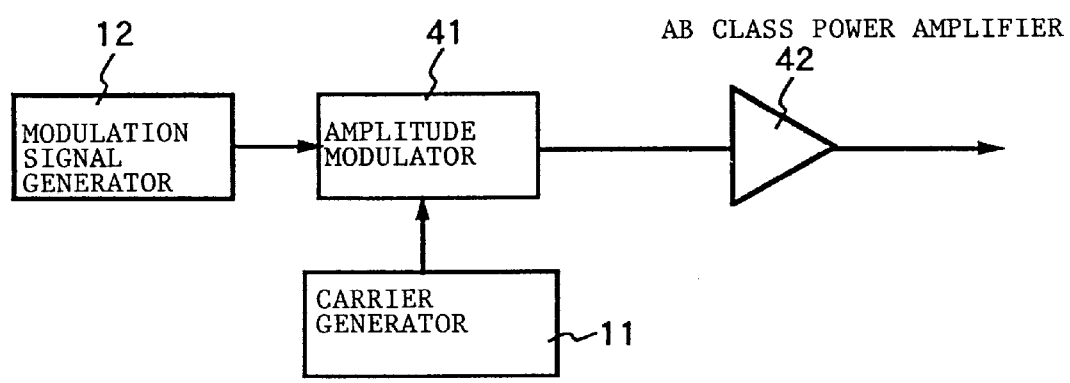
FIG. 1 is a block diagram of an example of a conventional amplitude modulation amplifier.
Figure 2:
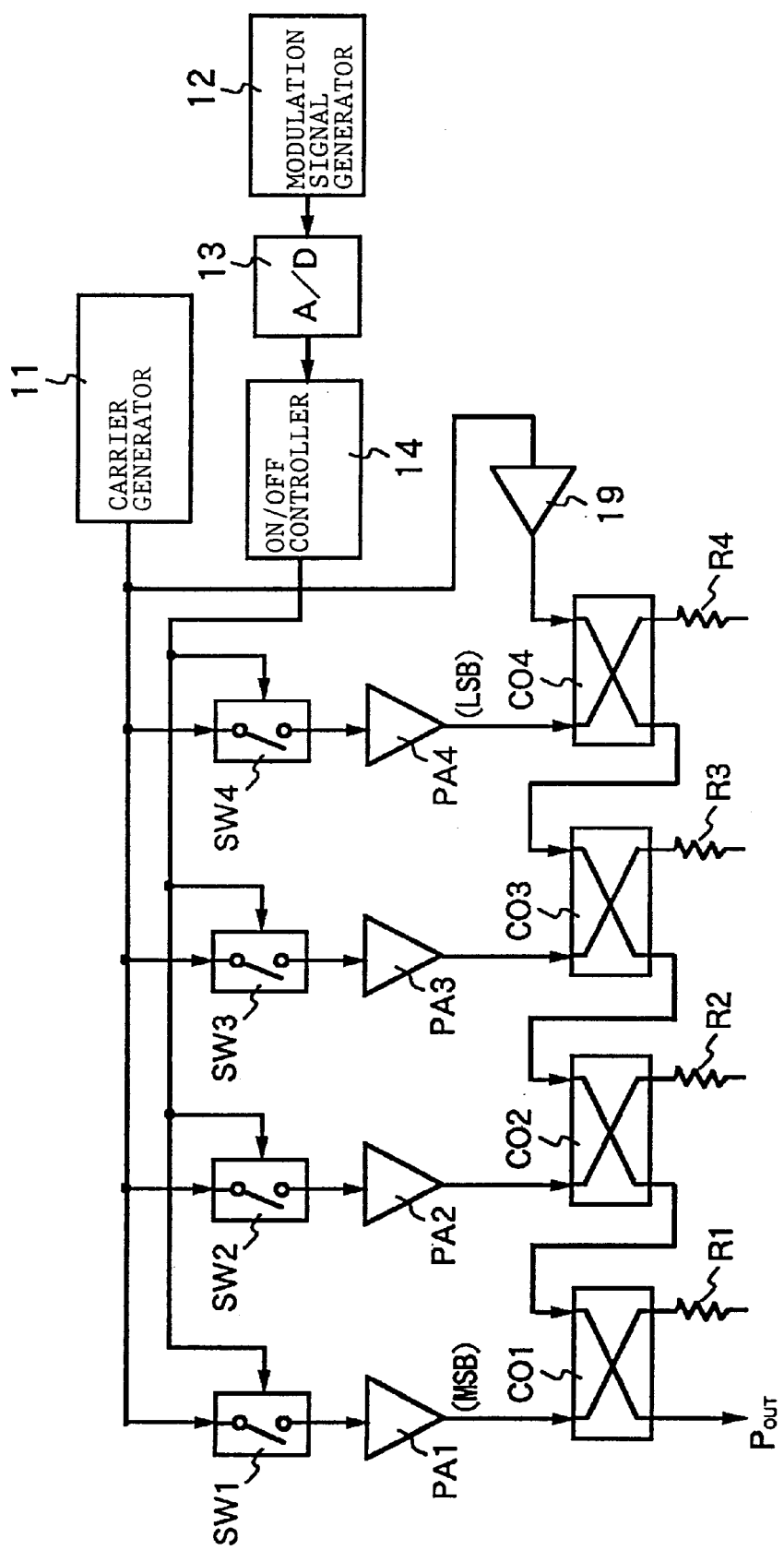
FIG. 2 is a block diagram of an example of a conventional digital amplitude modulation amplifier.
Figure 3:
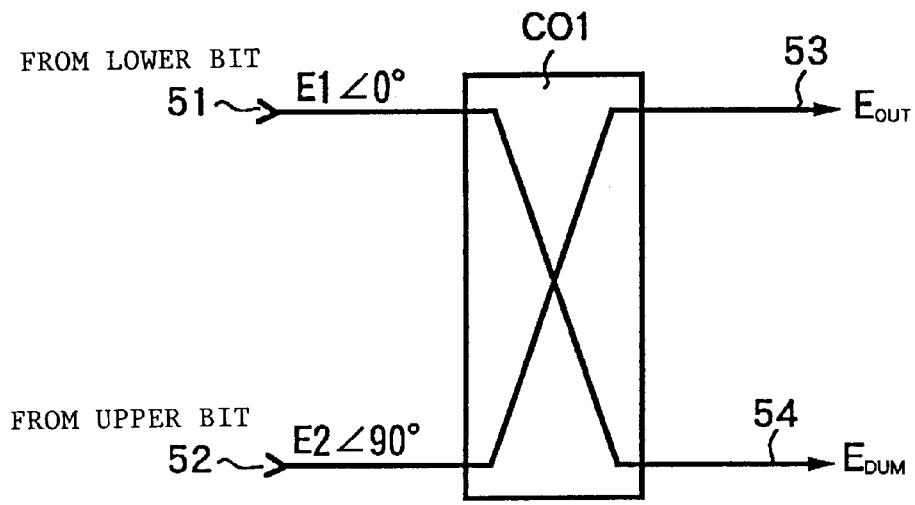
FIG. 3 is a block diagram of a 3 db coupler of FIG. 2.
Figure 4:
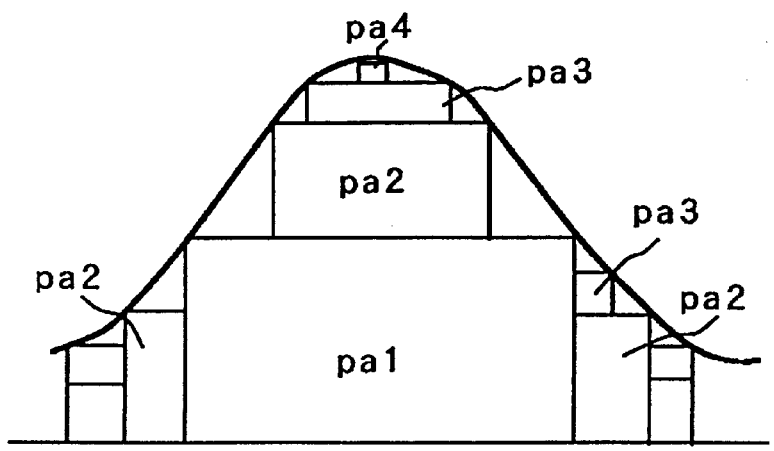
FIG. 4 is a diagrammatic view of a concept of composition of an output amplitude modulated wave of FIG. 2.
Figure 6:
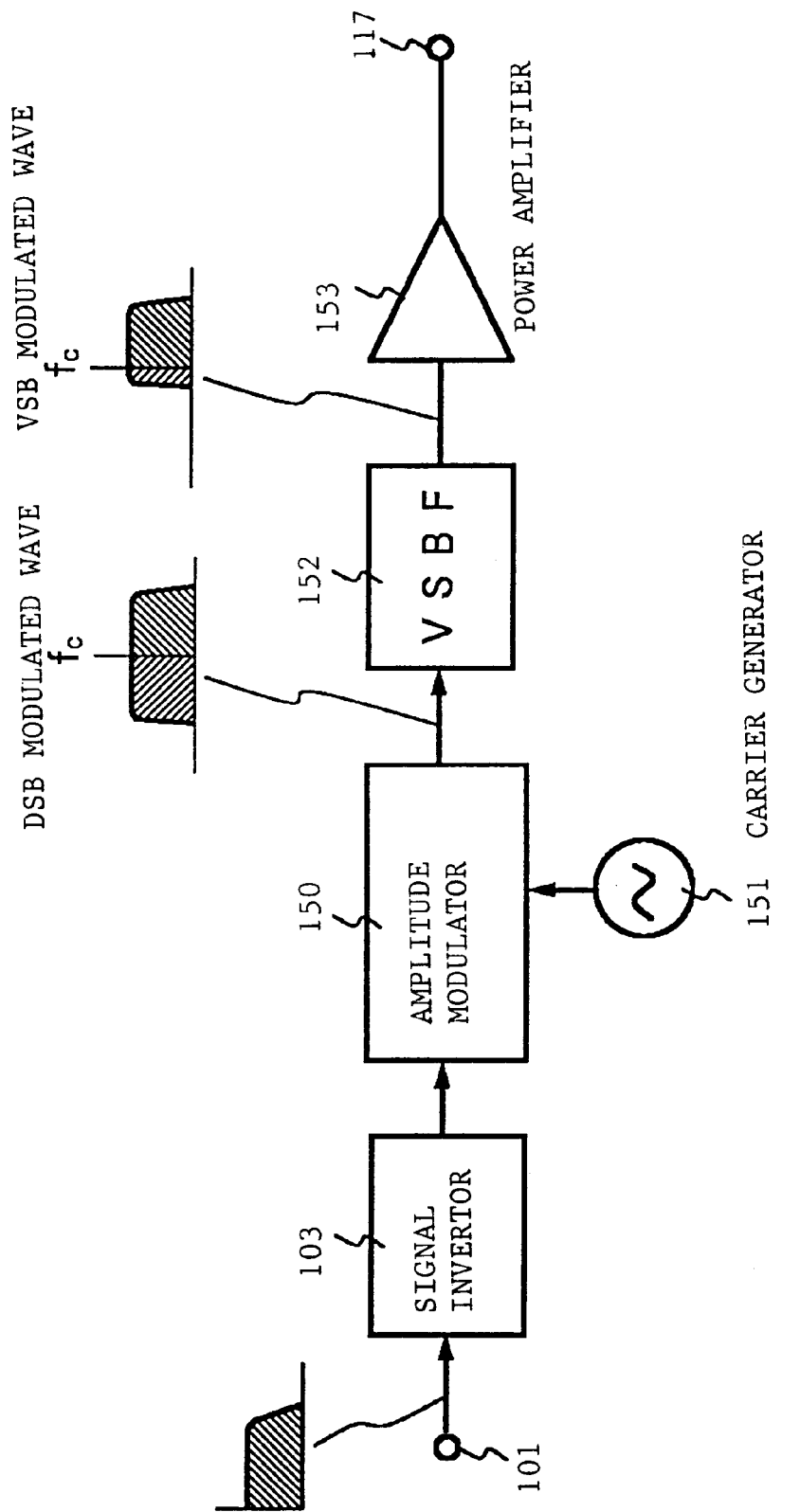
FIG. 6 is a block diagram of an example of a conventional television broadcasting machine.
Figure 7:
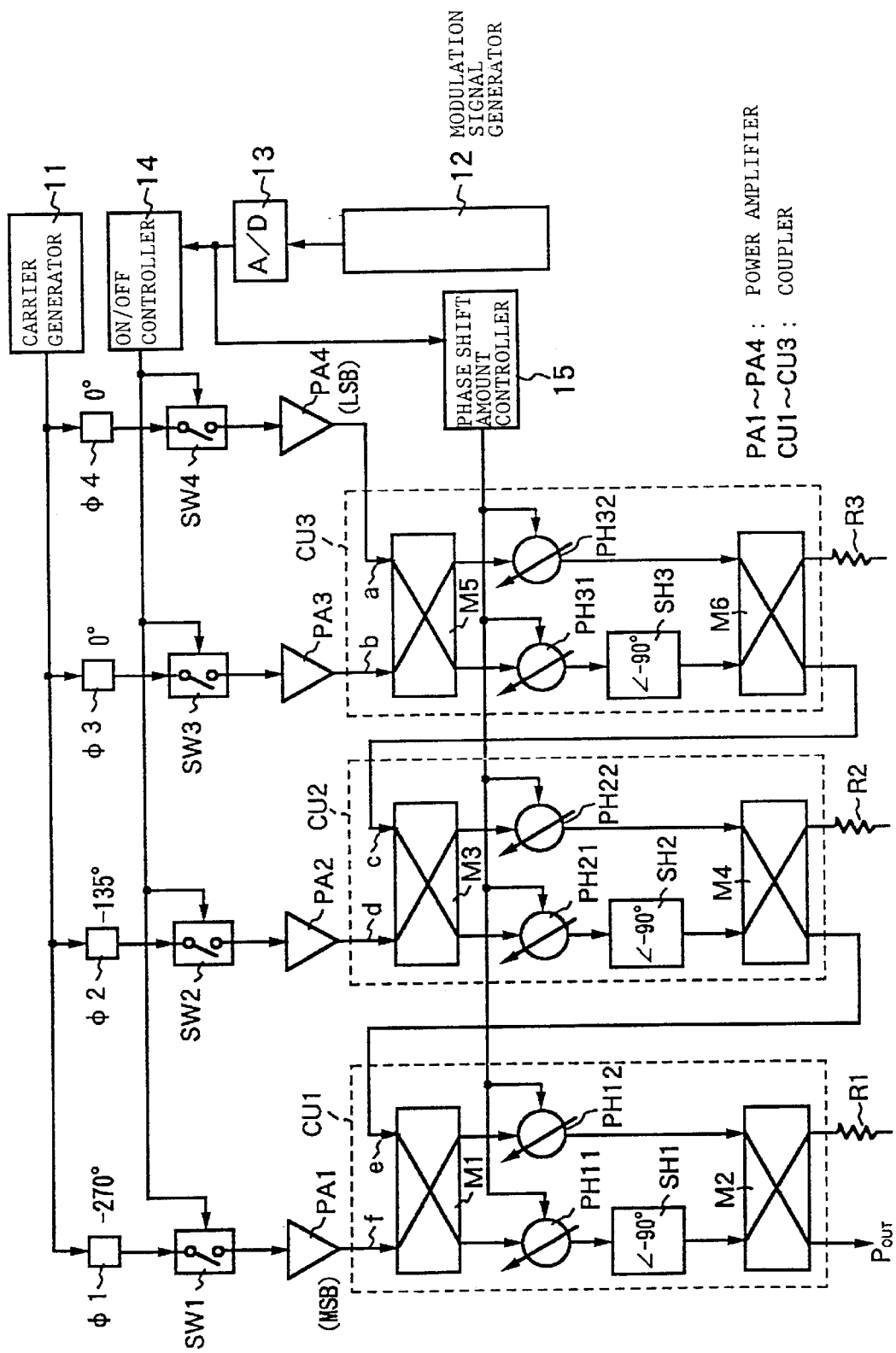
FIG. 7 is a block diagram of a first embodiment of the present invention.

FIG. 7 is a block diagram of a construction of an embodiment of a digital amplitude modulation amplifier according to the present invention. In FIG. 7, the same components as those of FIG. 2 are denoted by the same reference symbols. In particular, the digital amplitude modulation amplifier shown in FIG. 7 is similar to the conventional digital amplitude modulation amplifier shown in FIG. 2 in that it includes carrier generator 11, modulation signal generator 12, A/D converter 13 and on/off controller 14, and on/off controller 14 outputs a control signal for on/off switching four switches SW1 to SW4.

Power amplifiers PA1 to PA4 having amplification degrees weighted individually with individual bits of a 4-bit digital signal are provided corresponding to switches SW1 to SW4, respectively. Since a linear characteristic is not required for power amplifiers PA1 to PA4, power amplifiers PA1 to PA4 are constructed so as to effect a C class operation with which the power utilization efficiency is high.

Meanwhile, the present embodiment is different from the conventional digital amplitude modulation amplifier in that it includes phase shift amount controller 15 to which an output digital modulation signal of A/D converter 13 is inputted and phase shifters φ1 to φ4 to which an output carrier of carrier generator 11 is inputted, and couplers CU1, CU2 and CU3 provided corresponding to power amplifiers PA1, PA2 and PA3, respectively, are different in construction from 3 dB couplers CO1 to CO4 of the conventional digital amplitude modulation amplifier. Phase amount controller 15 is a memory to which the digital signal is inputted as an address, and generates a phase control signal indicative of a predetermined phase shift amount in response to the input address and outputs the phase control signal to couplers CU1 to CU3.

Figure 8:
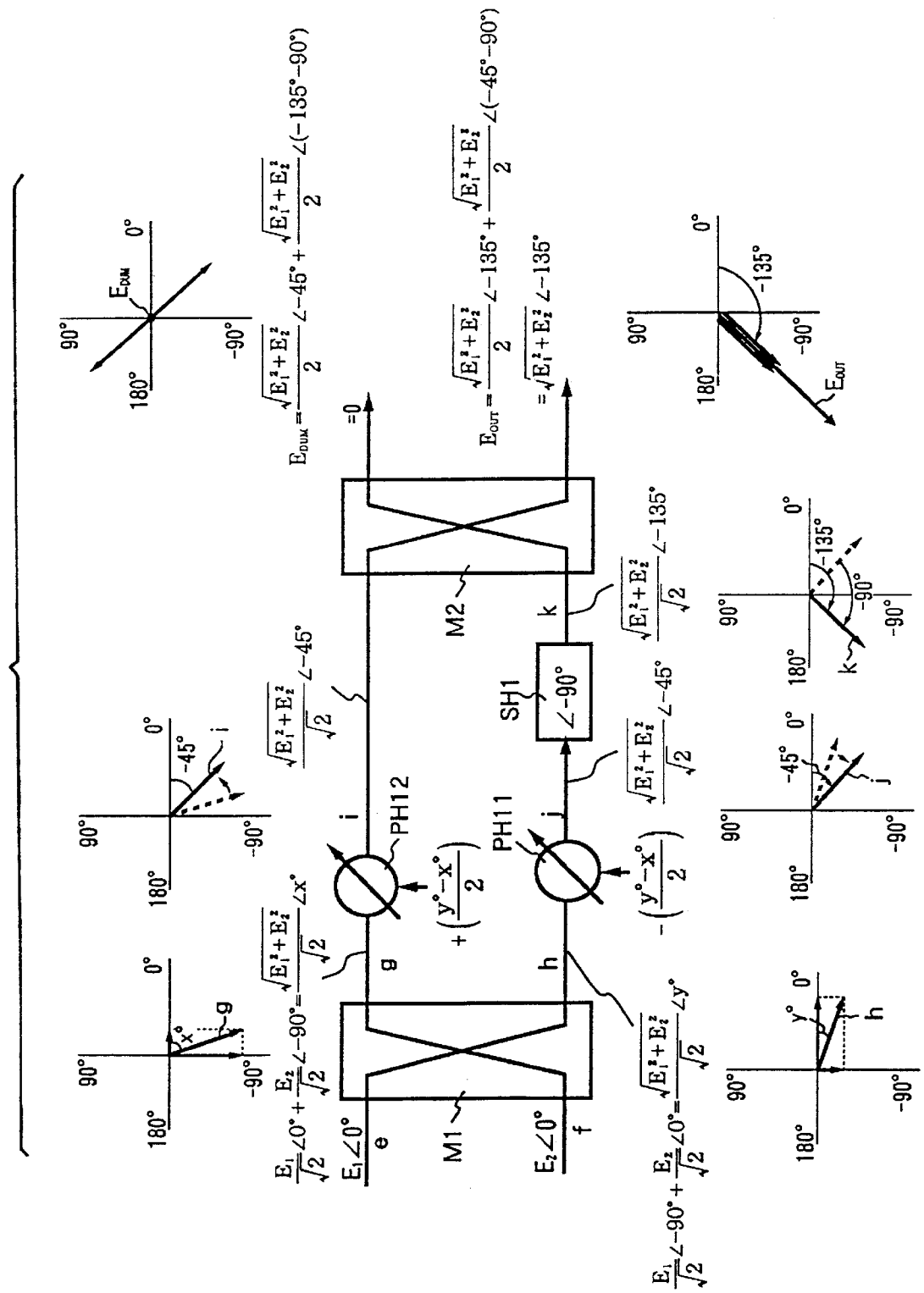
FIG. 8 is a diagrammatic view illustrating details of an example of a coupler shown in FIG. 7.

Each of couplers CU1, CU2 and CU3 has a second input terminal to which an output amplification carrier of a corresponding one of power amplifiers PA1, PA2 and PA3 is inputted, and a first input terminal to which an output signal of coupler CU2 or CU3 of the bit of the preceding stage (lower bit) or power amplifier PA4 is inputted. Each of couplers CU1, CU2 and CU3 includes first 3 dB coupler M1, M3 or M5 for coupling input signals to the two input terminals thereof, first variable phase shifter PH11, PH21 or PH31 to which one of two output signals of first 3 dB coupler M1, M3 or M5 is inputted, second variable phase shifter PH12, PH22 or PH32 to which the other of the two output signals of first 3 dB coupler M1, M3 or M5 is inputted, −90 degree phase shifter SH1, SH2 or SH3 for shifting the phase of an output signal of first variable phase shifter PH11, PH21 or PH31 by −90 degrees, and second 3 dB coupler M2, M4 or M6 for receiving and coupling output signals of second variable phase shifter PH12, PH22 or PH32 and −90 degree phase shifter SH1, SH2 or SH3. FIG. 8 is a view showing a detailed example of coupler CU1 of FIG. 7, and also the other couplers CU2 and CU3 have the same construction.

A coupling output signal of second 3 dB coupler M2 in coupler CU1 corresponding to the most significant bit (MSB) is outputted as circuit output voltage EOUT (output power POUT). It is to be noted that the phase shift amounts of first variable phase shifters PH11, PH21 and PH31 and second variable phase shifter PH12, PH22 and PH32 are controlled with an output control signal of phase shift amount controller 15.

Figure 9:
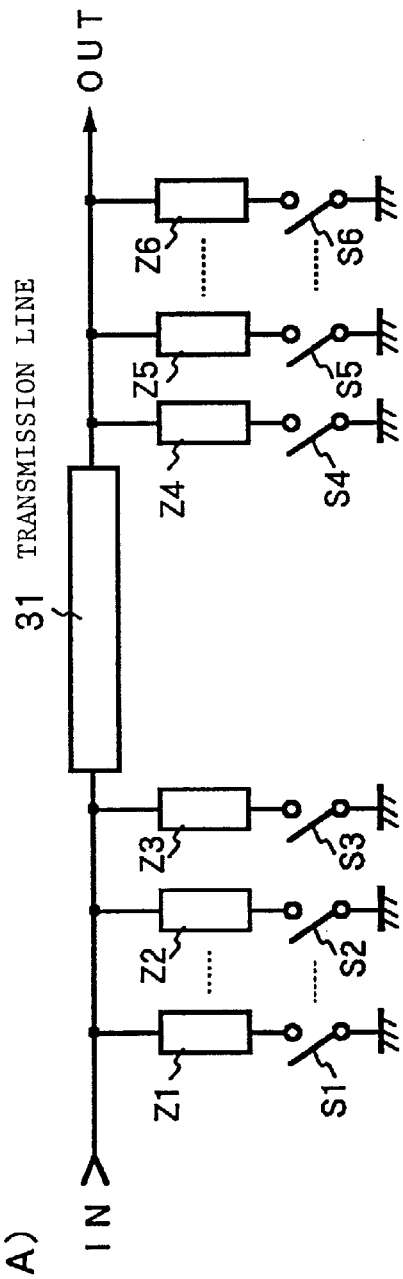
FIGS. 9(A) and 9(B) are diagrammatic views of an example of a phase shifter shown in FIG. 8.
Figure 9:
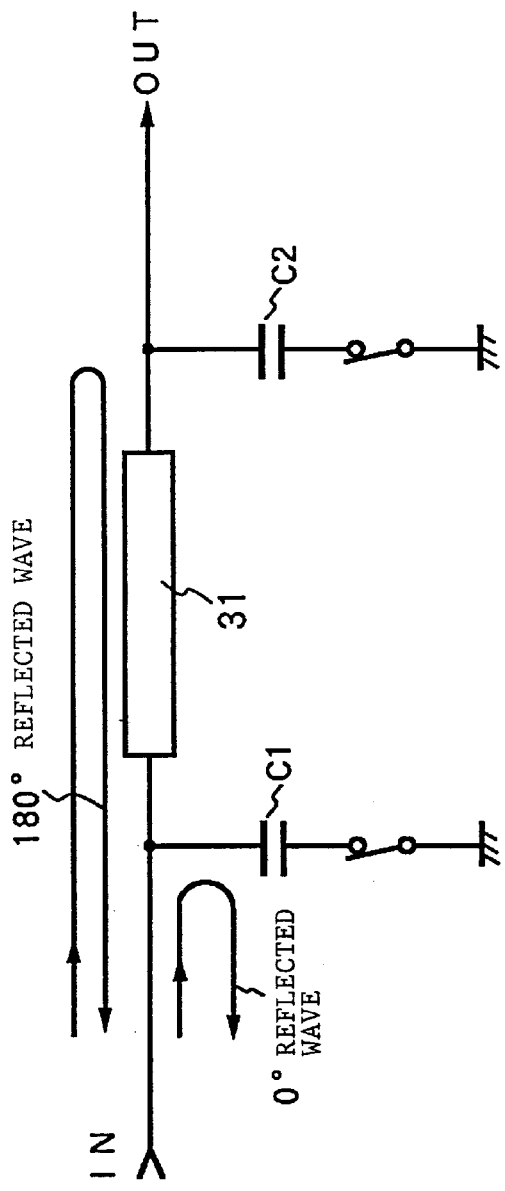

FIG. 9(A) shows a circuit diagram of an example of first and second variable phase shifters PH11 to PH32 of couplers CU1 to CU3. As shown in FIG. 9(A), variable phase shifters PH11 to PH32 have a π structure including transmission line 31 inserted in series in a signal line and a plurality of series circuits connected in parallel between the signal line and a reference voltage (ground) at the opposite ends of transmission line 31 and composed of impedance elements Z1 to Z6 and switch elements S1 to S6 paired with each other. Switch elements S1 to S6 are selectively switched on or off with an output control signal of phase shift amount controller 15 shown in FIG. 7.

By the way, if, for example, capacitors C1 and C2 which are capacitance elements are interposed as impedance elements in the line as seen in FIG. 9(B), then reflected waves are produced. However, if the length of transmission line 31 inserted in series is selected so that the reflected waves from capacitors C1 and C2 as viewed from the input end may have a phase difference of 180 degrees relative to each other, the reflected waves can cancel each other to suppress the reflection (VSWR). In this instance, if capacitors are used, then the reflected waves exhibit phase delays, but if coils which are inductance elements are used, then the reflected waves exhibit phase leads. For variable phase shifters PH11 and PH12 shown in FIG. 8, the structure of FIG. 9(B) described above is used such that output signals of the two variable phase shifters PH11 and PH12 may have a same phase by the control of the phase shift amounts of two variable phase shifters PH11 and PH12.

Next, operation of the embodiment shown in FIG. 7 is described with reference to FIGS. 7 to 9(B). Referring to FIG. 7, a carrier of a predetermined frequency generated by carrier generator 11 is first shifted in phase by predetermined angles of −270 degrees, −135 degrees, 0 degree and 0 degree by phase shifters $\phi 1$, $\phi 2$, $\phi 3$ and $\phi 4$, respectively, and then supplied to and power amplified by power amplifiers PA1, PA2, PA3 and PA4, respectively. As a requirement for each of couplers CU1 to CU3 to output an output signal which is a coupled signal of two input signals thereto as hereinafter described, it is required that the two input signals have the same phase, and phase shifters $\phi 1$, $\phi 2$, $\phi 3$ and $\phi 4$ are provided in order to satisfy the requirement. It is to be noted that no coupler need be provided for phase shifters $\phi 3$ and $\phi 4$ since the phase shift amounts of them are 0 degree.

Output signals f, d and b of power amplifiers PA1, PA2 and PA3 are supplied to first 3 dB couplers M1, M3 and M5 in couplers CU1, CU2 and CU3 provided corresponding thereto and are coupled to output signals e and c of couplers CU2 and CU3 of the preceding stage bits (lower bits) and output signal a of power amplifier PA4 of the least significant bit (LSB) by first 3 dB couplers M1, M3 and M5, respectively.

Since couplers CU1, CU2 and CU3 have the same construction, coupler CU1 is described as a representative of them with reference to FIG. 8. When input voltage El (signal e) and input signal E2 (signal f) are inputted in the same phase (0 degree) from the two input terminals in FIG. 8, voltages of an equal amplitude indicated by vectors g and h are outputted to the two output terminals of first 3 dB coupler M1. The phases of the output voltages vary as given by the following expressions depending upon the amplitude ratio between voltages E1 and E2:

$$\frac{E_1}{\sqrt{2}} \angle 0° + \frac{E_2}{\sqrt{2}} \angle -90° = \frac{\sqrt{E_1^2 + E_2^2}}{\sqrt{2}} \angle \left(-\tan^{-1}\frac{E_2}{E_1}\right) = A\angle x°$$

$$\frac{E_1}{\sqrt{2}} \angle -90° + \frac{E_2}{\sqrt{2}} \angle 0° = \frac{\sqrt{E_1^2 + E_2^2}}{\sqrt{2}} \angle \left(-\tan^{-1}\frac{E_1}{E_2}\right) = A\angle y°$$

where $$A = \frac{\sqrt{E_1^2 + E_2^2}}{\sqrt{2}}, \quad x° = -\tan\frac{-1 E_2}{E_1}, \quad y° = -\tan\frac{-1 E_1}{E_2}$$

The output voltages indicated by vectors h and g given above are adjusted in phase angle to −45 degrees as given by the following expressions as the phases thereof are controlled by $-\{(y'-x')/2\}$ and $+\{(y'-x')/2\}$ by phase shifters PH11 and PH12, respectively, so that they may be same as each other:

$$x° + \frac{(y° - x°)}{2} =$$

$$-\tan^{-1}\frac{E_2}{E_1} + \left(\frac{-\tan^{-1}\frac{E_1}{E_2} + \tan^{-1}\frac{E_2}{E_1}}{2}\right) = -\frac{\tan^{-1}\frac{E_2}{E_1} + \tan^{-1}\frac{E_1}{E_2}}{2} = -45°$$

$$y° - \frac{(y° - x°)}{2} = -\tan^{-1}\frac{E_1}{E_2} - \left(\frac{-\tan^{-1}\frac{E_1}{E_2} + \tan^{-1}\frac{E_2}{E_1}}{2}\right) =$$

$$-\frac{\tan^{-1}\frac{E_2}{E_1} + \tan^{-1}\frac{E_1}{E_2}}{2} = -45°$$

A signal outputted from phase shifter PH11 described above and having a phase of −45 degrees of a vector denoted by j in FIG. 8 is further shifted in phase by −90 degrees by phase shifter SH1 so that a signal having a phase of −135 degrees as indicated by vector k is obtained.

The signal outputted from phase shifter PH12 and having the phase of −45 degrees indicated by vector i in FIG. 8 and the signal outputted from phase shifter SH1 and having the phase of −135 degrees indicated by vector k in FIG. 8 are inputted as two input signals having an equal amplitude and having a phase difference of 90 degrees to the two input terminals of second 3 dB coupler M2. Second 3 dB coupler M2 couples the two input signals and outputs output voltage EOUT and dummy voltage EDUM represented by the following expressions and having vectors indicated in FIG. 8 to the two output terminals thereof:

$$E_{OUT} = \frac{A}{\sqrt{2}} \angle -135° + \frac{A}{\sqrt{2}} \angle (-45° - 90°) + \sqrt{2} A \angle -135° =$$

$$\sqrt{E_1^2 + E_2^2} \angle -135°$$

$$E_{DUM} = \frac{A}{\sqrt{2}} \angle -45° + \frac{A}{\sqrt{2}} \angle (-135° - 90°) =$$

$$\frac{A}{\sqrt{2}} \angle -45° + \frac{A}{\sqrt{2}} \angle -225° = 0$$

As can be seen from the expressions above, all voltages E1 and E2 are outputted as output voltage EOUT while dummy voltage EDUM to be outputted to the dummy output terminal is reduced to zero (no signal is led out).

In this manner, in FIG. 8, as two input signals are applied in the same phase to first 3 dB coupler M1 and the two output signals of first 3 dB coupler M1 are controlled by phase shifters PH11 and PH12 so that they may have a same phase and besides the two input signals to be inputted to second 3 dB coupler M2 are controlled by phase shifter SH1 so that they may have a phase difference of 90 degrees from each other and the input signals controlled in this manner are inputted to second 3 dB coupler M2, dummy voltage EDUM is reduced to zero and the two signals inputted are all led out as output voltage EOUT. It is to be noted that the phase of output voltage EOUT in this instance is different by −135 degrees from those of input signals E1 and E2 and is fixed irrespective of the levels of input voltages E1 and E2.

Here, when the amplitudes of two input signals e and f are different from each other, the amplitudes of the two signals (indicated by vectors g and h in FIG. 8) outputted from first 3 dB coupler M1 are equal to each other, but the phases of them are different from each other. Those signals are controlled by phase shifters PH11 and PH12 so that they may have a same phase. A circuit of the construction of FIG. 9 described hereinabove is used for phase shifters PH1 and PH12, and a method of obtaining same phase signals using phase shifters PH11 and PH12 is described below.

In this instance, in order to simplify the control of the phase shift amounts of phase shifters PH11 and PH12, a tolerance of 90±18 degrees is set for the phase difference between the input signals to each of phase shifters PH11 and PH12, and the phases are controlled stepwise. It is to be noted that the loss originating from a phase error of ±18 degrees is 2.3% in the maximum and can be ignored.

In order that the conditions described above may be satisfied, the the power ratio relationships between powers E and F of input signals e and f, the phase difference between the two signals (indicated by vectors g and h in FIG. 8) outputted from first 3 dB coupler M1, the phase shift control amounts of phase shifters PH11 and PH12 by phase shift amount controller 15 and the phase difference between the two signals (indicated by vectors i and k in FIG. 8) inputted to second 3 dB coupler M2 is set in such a manner as illustrated, for example, in a table of FIG. 10. The reason why the phase difference between the two signals (indicated by vectors g and h in FIG. 8) outputted from first 3 dB coupler M1 is classified in ranges of 18 degrees in FIG. 10 is that it is intended to simplify the phase control (however, an error of 2 to 3% is permitted). Further, in FIG. 10, voltage ratios are squared to convert them into power ratios.

As can be seen from FIG. 10, since states of the two input signals are limited to several combinations, phase shift amount control for all angles over 360 degrees is not required, but a step phase shifter which can provide phase shift amounts of +36, 0, −9, −18, −27 and −36 degrees may be used for phase shifter PH11 while another step phase shifter which can provide phase shift amounts of −36, 0, +9, +18, +27 and +36 degrees may be used. It is to be noted that the basic phase shift amounts in FIG. 10 are represented by $-\{(y°-x°)/2\}$ and $+\{(y°-x°)/2\}$ given hereinabove.

Phase shifters PH11 and PH12 which realize the phase shift amounts described above are shown in FIGS. 11(A) and 11(B), respectively. Each of phase shifters PH11 and PH12 has a π structure including transmission line 31 inserted in series in a signal line and capacitors or coils interposed between the signal line and a reference voltage (ground) at the opposite ends of transmission line 31. Switch elements S11 to S20 or S21 to S30 which are selectively switched on or off by an output control signal of phase shift amount controller 15 shown in FIG. 7 are connected in series to the corresponding capacitors or coils between the capacitors or coils and the reference voltage (ground).

Figure 11:
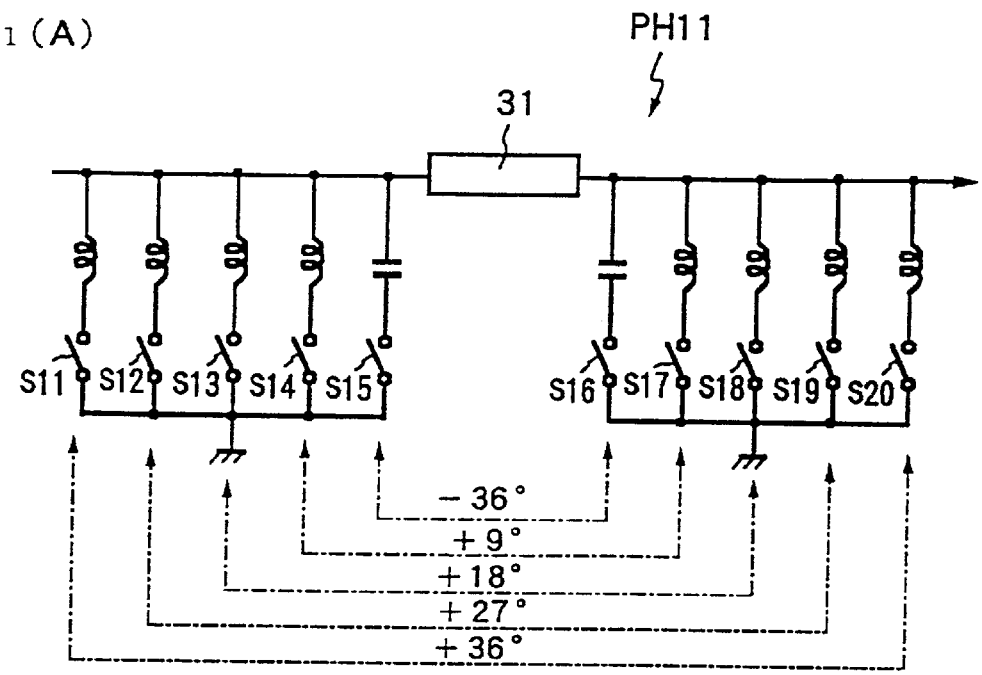
FIGS. 11(A) and 11(B) are diagrammatic views showing constructions of different examples of phase shifters in the coupler shown in FIG. 7.
Figure 11B:
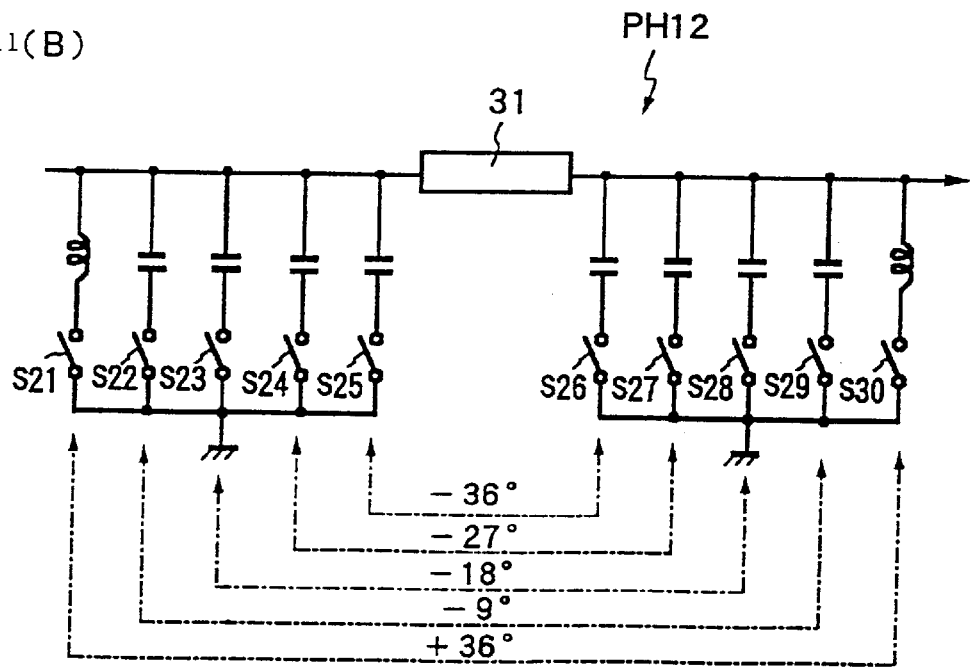

In order to obtain a phase delay, a switch element is controlled to an on-state so that a capacitor may be connected to the input terminal and the output terminal of transmission line 31, but in order to obtain a phase lead, another switch element is controlled to an on-state so that a coil may be connected to the input terminal and the output terminal of transmission line 31. In FIGS. 11(A) and 11(B), each numerical value represents a phase shift amount to be obtained, and associated arrow marks indicate switch elements to be switched on in order to obtain the phase shift amount. It is to be noted that, in order to obtain the phase shift amount of 0 degree, all of switch elements S11 to S20 and S21 to S30 are opened (off). Consequently, a signal passes only through transmission line 31, and the phase shifter exhibits a through-state and the phase shift amount of 0 degree is obtained.

The output amplification signals of power amplifiers PA4 and PA3 are controlled by coupler CU3 so that the phase difference between them may be 90 degrees as they are inputted as signals a and b in a same phase to and coupled by first first 3 dB coupler M5 and the two output signals of first 3 dB coupler M5 are phase shifted by variable phase shifters PH31 and PH32 so that they may have the same phase and then the output signal of variable phase shifter PH31 is phase shifted by −90 degrees, and the output amplification signals controlled in this manner are inputted to second variable 3 dB coupler M6. Consequently, two input signals a and b inputted are all led out as an output voltage and inputted as signal c to first variable 3 DB coupler M5 of coupler CU2.

Here, since output voltage c of coupler CU3 inputted to one of the two input terminals of first 3 dB coupler M3 in coupler CU2 is displaced by −135 degrees from input signals a and b, it is phase shifted by −135 degrees by phase shifter φ2 and inputted to first 3 dB coupler M3 so that signal d to be inputted to the other input terminal of first 3 dB coupler M3 through switch SW2 and power amplifier PA2 may have a same phase as signal c. Thus, two input signals c and d are coupled by first 3 dB coupler M3. The two output signals of first 3 dB coupler M3 are controlled in phase by variable phase shifters PH21 and PH22 so that they may have a same phase and the output signal of phase shifter PH1 is phase shifted by −90 degrees by phase shifter SH2 so that the two output signals of first 3 dB coupler M3 are controlled so as to have a phase difference of 90 degrees and inputted to second 3 dB coupler M4 in this state. Then, the two signals are coupled by second 3 dB coupler M4 so that they are all outputted as an output voltage from second 3 dB coupler M4 and inputted as signal e to first 3 dB coupler M1 of coupler CU1.

Since output voltage e of coupler CU2 inputted to one of the two input terminals of first 3 dB coupler M1 in coupler CU1 is displaced by −135 degrees from input signals c and d (by −270 degrees from signals a and b), it is phase shifted by −270 degrees in advance by phase shifter φ1 so that signal f to be inputted to the other input terminal of first 3 dB coupler M1 through switch SW1 and power amplifier PA1 may have the same phase as signal e, and output voltage e phase shifted in this manner is inputted to coupler CU1. Those input signals e and f are coupled by coupler CU1, from which two signals e and f inputted are all led out as output voltage EOUT while dummy voltage EDUM is reduced to zero.

Switches SW1 to SW4 of the digital amplitude modulation amplifier shown in FIG. 7 exhibit totaling $16(=2^4)$ combinations of on/off states in response to different levels of the modulation signal, and input signal powers of couplers CU1 to CU3 and power ratios between them and phase shift amounts of first variable phase shifters PH11 to PH31 and second variable phase shifters PH12 to PH32 in the 15 combinations of on/off states except the combination of off states of all of switches SW1 to SW4 are collectively illustrated in a table of FIG. 12. Referring to FIG. 12, A, B, C, D, E and F represent the powers of input signals a, b, c, d, e and f, respectively, and when any of power amplifiers PA1 to PA4 is "1", this represents that a corresponding one of switches SW1 to SW4 provided corresponding to power amplifiers PA1 to PA4, respectively, is on and that one of power amplifiers PA1 to PA4 has an input and an output.

FIG. 13 is a table illustrating the relationship of the input modulation signal level of the digital amplitude modulation amplifier shown in FIG. 7 to input power PIN, output power POUT and loss LOSS in the 15 combinations of on/off states of switches SW1 to SW4 described above. Here, the input modulation signal level is denoted by INPUT, and input power PIN is a total power of input signals a, b, c and d. Meanwhile, output power POUT represents the output power of the output terminal of coupler CU1.

As apparent from FIG. 13, the loss power (LOSS) which is absorbed by dummy resistors R1 to R3 of couplers CU1 to CU3 is lower than 0.2 dB and is reduced remarkably from that of the conventional digital amplitude modulation amplifier. The loss power can be further reduced by increasing the variable step widths of the phase shift amounts of phase shifters PH11 to PH32.

Figure 14:
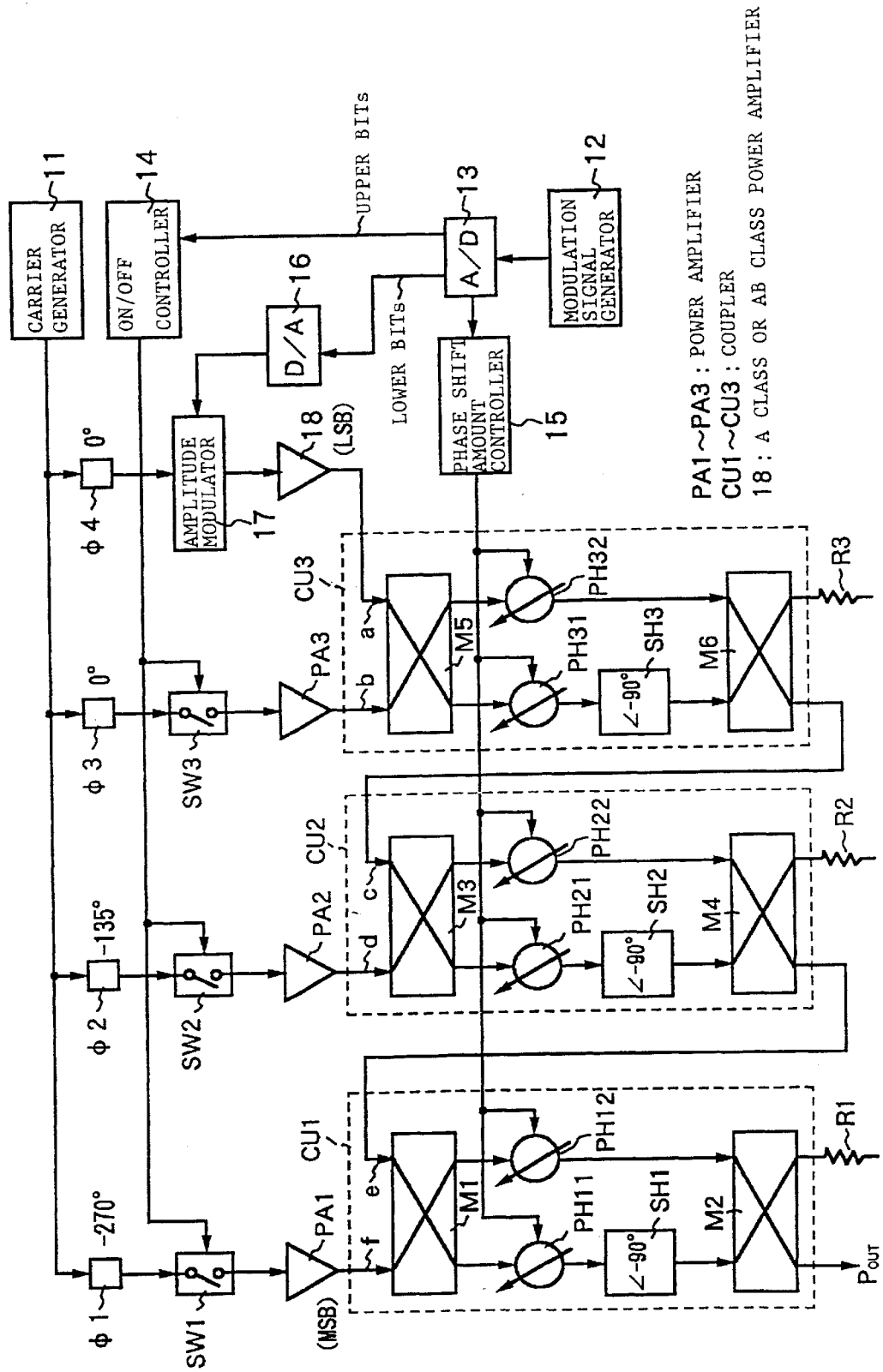
FIG. 14 is a block diagram of a construction of a second embodiment of the present invention.

Next, a second embodiment of the present invention is described. FIG. 14 shows a block diagram of the second embodiment of the digital amplitude modulation amplifier according to the present invention. In FIG. 14, the same components as those of FIG. 7 are denoted by the same reference symbols, and overlapping description of them is omitted here. The embodiment shown in FIG. 14 is characterized in that a single amplitude modulator 17 and a single A class or AB class power amplifier 18 are provided for lower bits of an output digital signal of A/D converter 13.

Referring to FIG. 14, a digital output signal of A/D converter 13 is divided into upper bits and lower bits determined in advance, and only the upper bits are supplied to on/off controller 14 while the lower bits are supplied to D/A converter 16 and converted into an analog signal by D/A converter 16. Here, the upper bits and the lower bits are determined arbitrarily. Here, for simplified description, it is assumed, as an example, that the digital signal has 4 bits and 1 bit is used as the lower bits while the other 3 bits are used as the upper bits.

The output analog signal of D/A converter 16 is supplied to amplitude modulator 17, by which a carrier from carrier generator 11 inputted thereto through phase shifter φ4 is amplitude modulated in an analog fashion with the inputted output analog signal. The amplitude modulated wave obtained by amplitude modulator 17 and corresponding to the lower bit is first power amplified by A class or AB class liner power amplifier 18 and then inputted to coupler CU1, by which it is coupled to (power amplified with) an output signal corresponding to the upper bit of power amplifier PA1.

Accordingly, in the present embodiment, the lower bits are replaced by one class power amplifier 18. While 1 bit is used as the lower bits for simplified illustration in FIG. 14, if it is assumed otherwise that the digital signal has 8 bits and the lower bits are 3 bits while the upper bits are 5 bits, then a digital amplitude modulation amplifier can be formed from five power amplifiers PA and five couplers and one A class or AB class power amplifier 18.

Therefore, while, in the first embodiment wherein a number of power amplifiers equal to the number of bits of the digital signal must be prepared, the number of power amplifiers increases as the number of bits increases, the present embodiment has an advantage in that, even if the number of bits of the digital signal increases, it can be formed using a number of power amplifiers smaller than that of the first embodiment.

Figure 15:
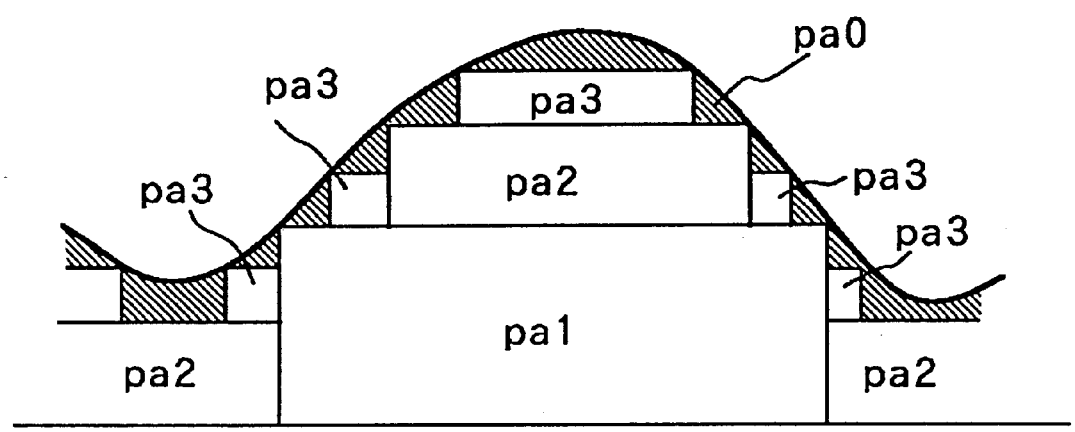
FIG. 15 is a diagrammatic view of a concept of composition of an output modulated wave of FIG. 14.

FIG. 15 shows a diagrammatic view of a concept of composition of an output amplitude modulated wave of the second embodiment shown in FIG. 14. In FIG. 15, pa1 to pa3 denote output signal components of power amplifiers PA1 to PA3 corresponding to the upper bits in the output amplitude modulated wave, and slanting line portion pa0 indicates an analog amplitude modulated wave component corresponding to the lower bits.

Although use of A class or AB class power amplifier 18 deteriorates the power utilization efficiency, since the signal level corresponding to the lower bit is very low comparing with those of the upper bits as seen from FIG. 15, the deterioration of the efficiency by the lower bits does not have a much influence upon the efficiency of the entire amplifier. Further, the envelopes of the amplitude modulated wave become smooth and also production of harmonics can be reduced.

Figure 16:
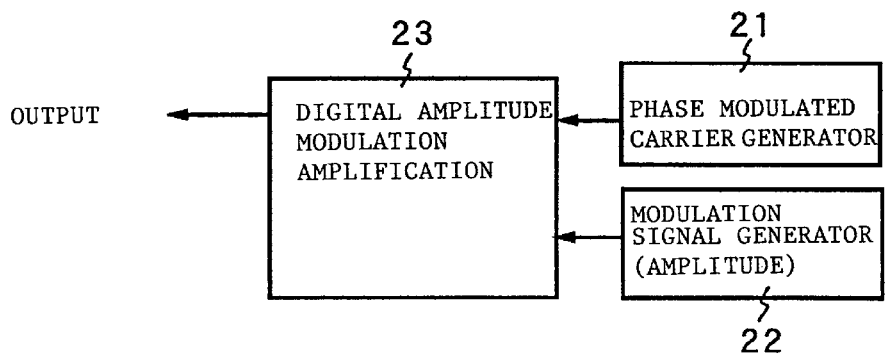
FIGS. 16(A), 16(B) and 16(C) are a block diagram of a construction of a third embodiment of the present invention and diagrammatic views of applied modulated waves, respectively.
Figure 16:
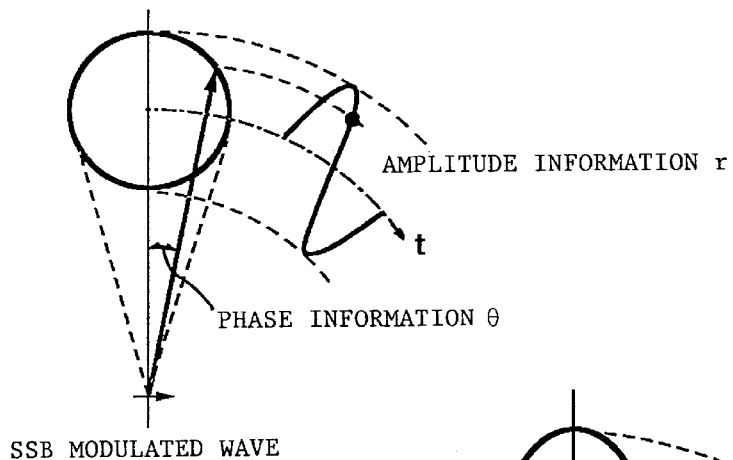
Figure 16:
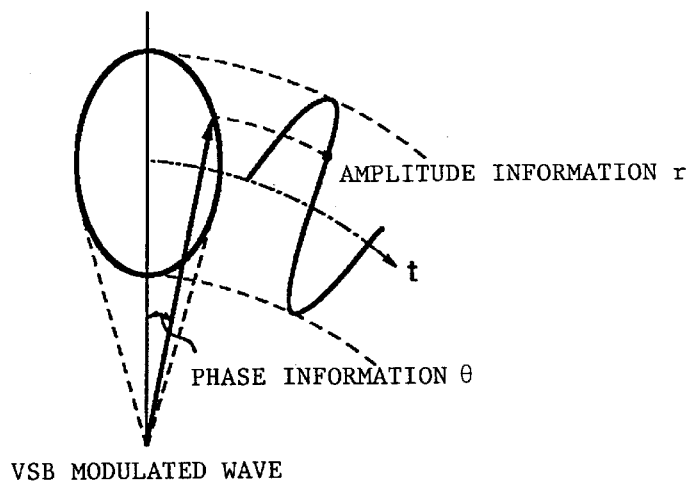

Next, a third embodiment of the present invention is described. FIG. 16(A) shows a block diagram of the third embodiment of the digital amplitude modulation amplifier according to the present invention. As shown in FIG. 16(A), the digital amplitude modulation amplifier includes phase modulated carrier generator 21, modulation signal generator 22 and digital amplitude modulation amplification element 23. Digital amplitude modulation amplification element 23 has a circuit construction of one of the embodiments of the present invention shown in FIGS. 7 and 14 except carrier generator 11 and modulation signal generator 12.

In other words, the present third embodiment includes, in place of carrier generator 11 of the first or second embodiment, phase modulated carrier generator 21 which receives, as input signals to the power amplifiers corresponding to the individual bits, a carrier phase modulated with an information signal different from the modulation signal of modulation signal generator 22 so that a modulated wave which is modulated in both amplitude and phase can be obtained.

With the present third embodiment, since a phase modulated carrier can be amplitude modulated, a single side band (SSB) signal can be obtained by amplitude modulating a carrier phase modulated with phase information θ with a modulation signal having amplitude information r and represented by Vm·cos ωmt as seen in FIG. 16(B). Further, a vestigial side band (VSB) signal represented by a vector which draws an elliptical locus can be obtained by amplitude modulating a carrier phase modulated with phase information σ with modulation signal Vm1·cos ωm1t or Vm2·cos ωm2t having amplitude information r as seen from FIG. 16(C).

It is to be noted that the present invention is not limited to the embodiments described above. For example, while, in FIG. 7, the number of couplers is 3 including couplers CU1 to CU3 and the number of power amplifiers is 4 including power amplifiers PA1 to PA4, the number of couplers may be an arbitrary number N corresponding to a quantization bit number of a digital signal while the number of C class power amplifiers may be (N+1). Meanwhile, in the embodiment of FIG. 14, if the number of the lower bits is m, then the amplifier can be constructed using (N+1−m) C class power amplifiers PA and one A class or AB class power amplifier 18.

As described above, according to the present invention, where a plurality of C class power amplifiers which exhibit a high power utilization efficiency are used and output signals of the power amplifiers are composed using couplers, since the power loss absorbed by dummy loads to the couplers can be substantially eliminated, a digital amplitude modulation amplifier which is higher in power utilization efficiency than conventional digital amplitude modulation amplifiers and regenerates the amplitude of an input modulation signal with a high degree of fidelity.

Further, according to the present invention, since power amplifiers which are provided corresponding to the upper bits of a digital signal and effect a C class operation are used while a single A class or AB class power amplifier is used commonly for the lower bits of the digital signal, also where the number of bits of the digital signal is large, the digital amplitude modulation amplifier can be formed in a simple construction.

Further, according to the present invention, if an input carrier is phase modulated with a desired information signal in advance, since a modulated wave which includes both of amplitude information and phase information can be outputted, a digital amplitude modulation amplifier having a high universality can be realized.

Next, embodiments of a television broadcasting machine of the present invention are described with reference to the drawings.

Figure 17:
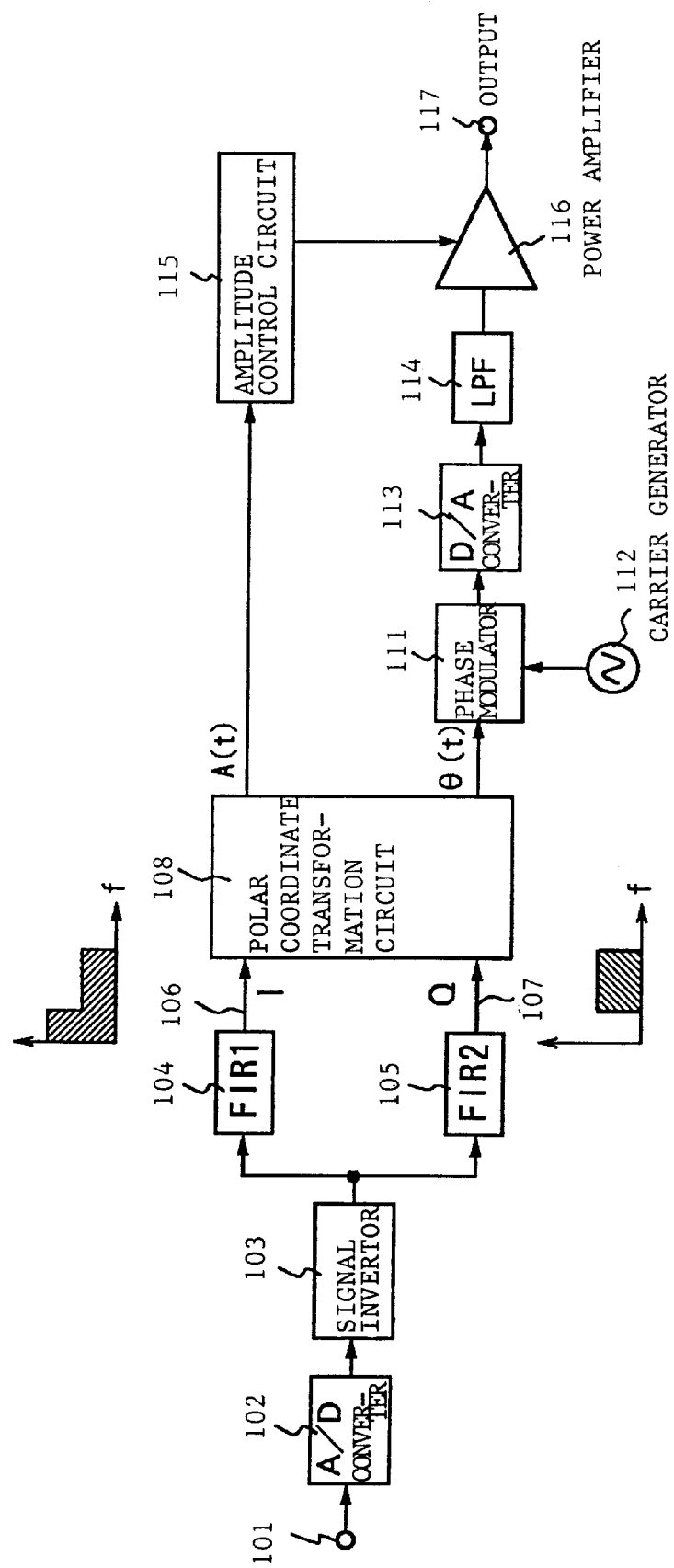
FIG. 17 is a block diagram of a fourth embodiment of the present invention.

FIG. 17 shows a block diagram of a television broadcasting machine of a fourth embodiment of the present invention. Referring to FIG. 17, an analog video signal inputted via input terminal 101 is converted into a digital signal by A/D converter 102 and then inverted by signal invertor 103, whereafter it is inputted to first finite impulse response (FIR) digital filter 104 and second finite impulse response (FIR) digital filter 105.

Figure 18:
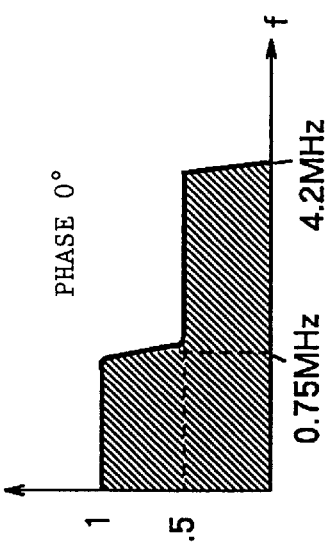
FIGS. 18(A), 18(B) and 18(C) are characteristic diagrams of FIR digital filters shown in FIG. 17.
Figure 18:
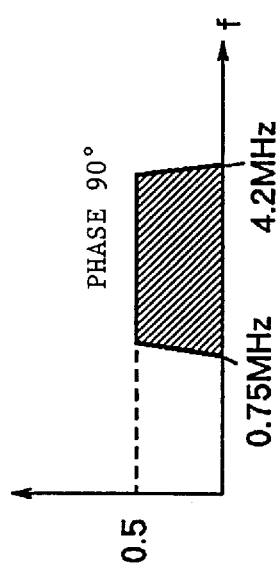
Figure 18:
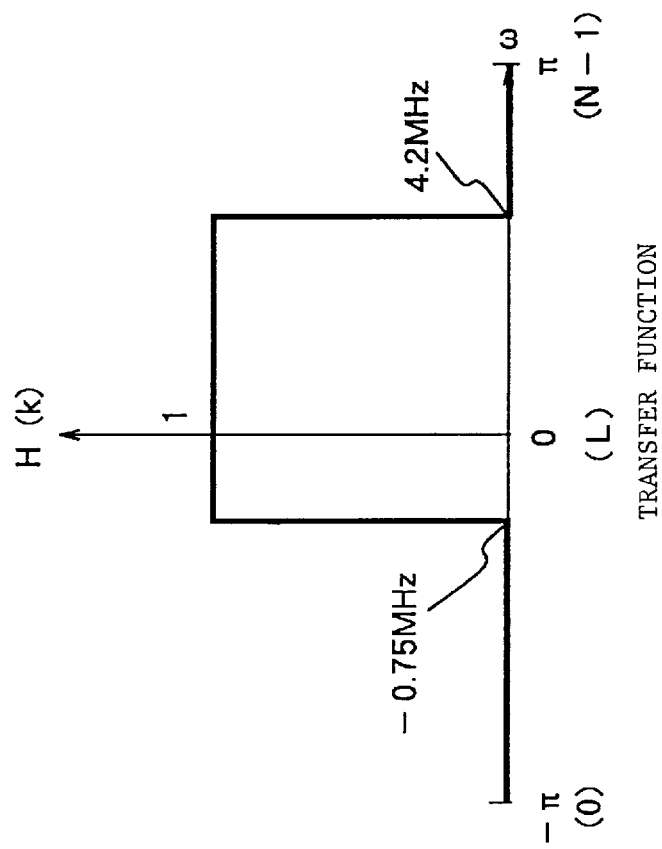

First FIR digital filter 104 has a frequency characteristic, for example, as shown in FIG. 18(A) such that it passes therethrough signal components of a band which makes the DSB part of a VSB signal and limits the amplitude of signal components of another band which makes the SSB part to ½ time. In FIG. 18(A), frequency components lower than 0.75 MHz are signal components of the band which makes the DSB part of a VSB signal, and frequency components from 0.75 MHz to 4.2 MHz are signal components of the band which makes the SSB part. From this first FIR digital filter 104, I information 106 is extracted.

Meanwhile, second FIR digital filter 105 has such a frequency characteristic, for example, illustrated in FIG. 18(B) that it passes therethrough only signal components of a band which makes the SSB part of a VSB signal with an amplitude equal to ½ that of the input thereto and the phase of the output signal thereof is displaced by 90 degrees from that of the output signal of first FIR digital filter 104. In FIG. 18(B), signal components from 0.75 MHz to 4.2 MHz are signal components of a band which makes an SSB. From this second FIR digital filter 105, Q information 107 is extracted.

Impulse responses for calculation of coefficients of those FIR digital filters 104 and 105 are given by the expressions given below. Here, N represents the tap coefficients of FIR digital filters 104 and 105, and in order to satisfy the specifications for a television signal, 128 taps or more are required.

$$\text{First FIR digital filter 4:} \quad h(n) = \frac{1}{N}\sum_{k=0}^{N-1} H(k)\cos\{2\pi n(k-L)/N\}$$

$$\text{Second FIR digital filter 5:} \quad h(n) = \frac{1}{N}\sum_{k=0}^{N-1} H(k)\sin\{2\pi n(k-L)/N\}$$

Transmission function H(k) is given asymmetrically with respect to angular frequency ω=0 as given by the following expression:

$$H(k) = \begin{cases} 1(-0.75\text{MHz} < k < +4.2\text{MHz}) \\ 0(k \leq -0.75\text{MHz}, k \geq +4.2\text{MHz}) \end{cases}$$

Figure 19:
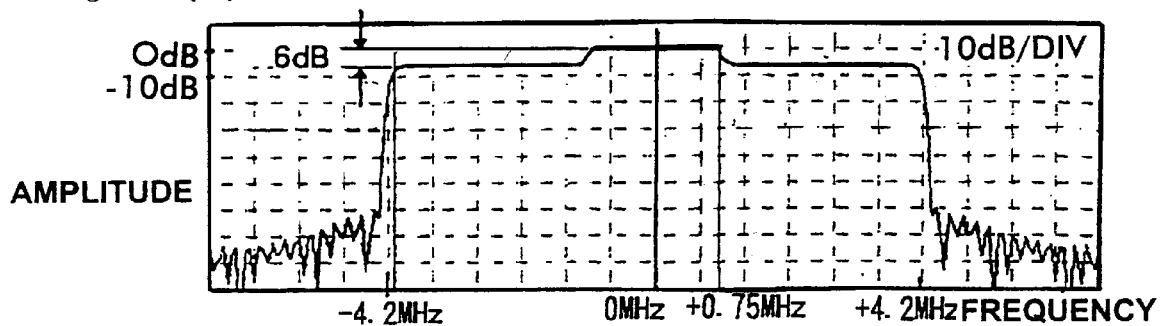
FIGS. 19(A) 19(B) 19(C) and 19(D) are diagrams illustrating examples of characteristics of the FIR digital filters shown in FIG. 17.
Figure 19:
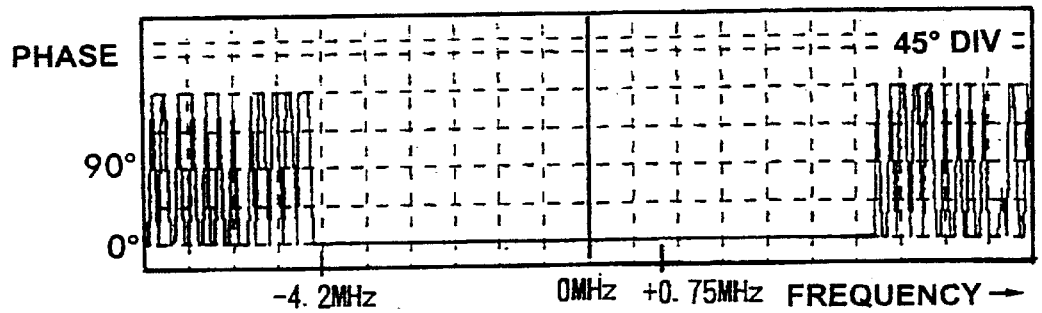
Figure 19:
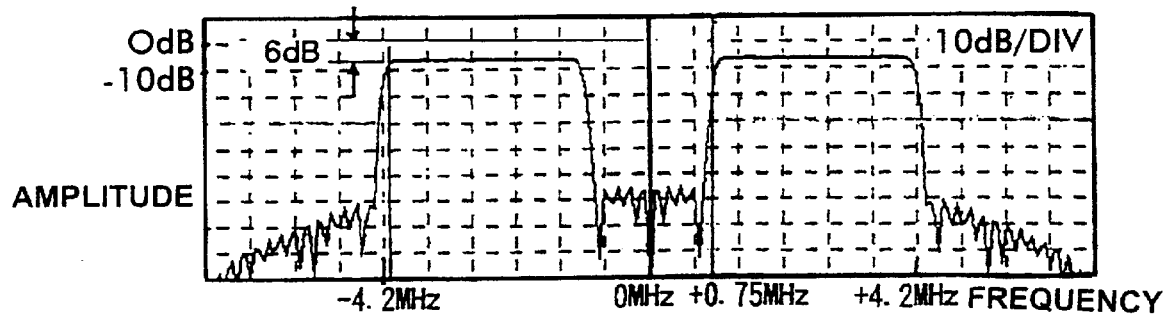
Figure 19:
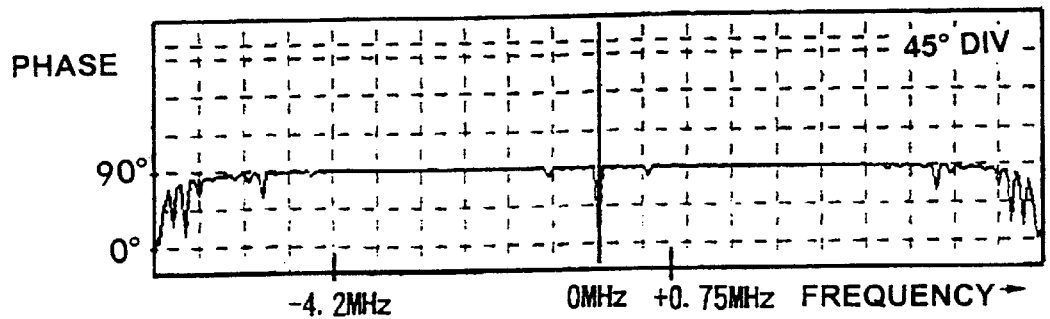

An example of the amplitude-frequency characteristic of first FIR digital filter 104 described above is illustrated in FIG. 19(A), and an example of the phase-frequency characteristic is illustrated in FIG. 19(B). Meanwhile, an example of the amplitude-frequency characteristic of second FIR digital filter 105 is illustrated in FIG. 19(C), and an example of the phase-frequency characteristic is illustrated in FIG. 19(D).

Figure 20:
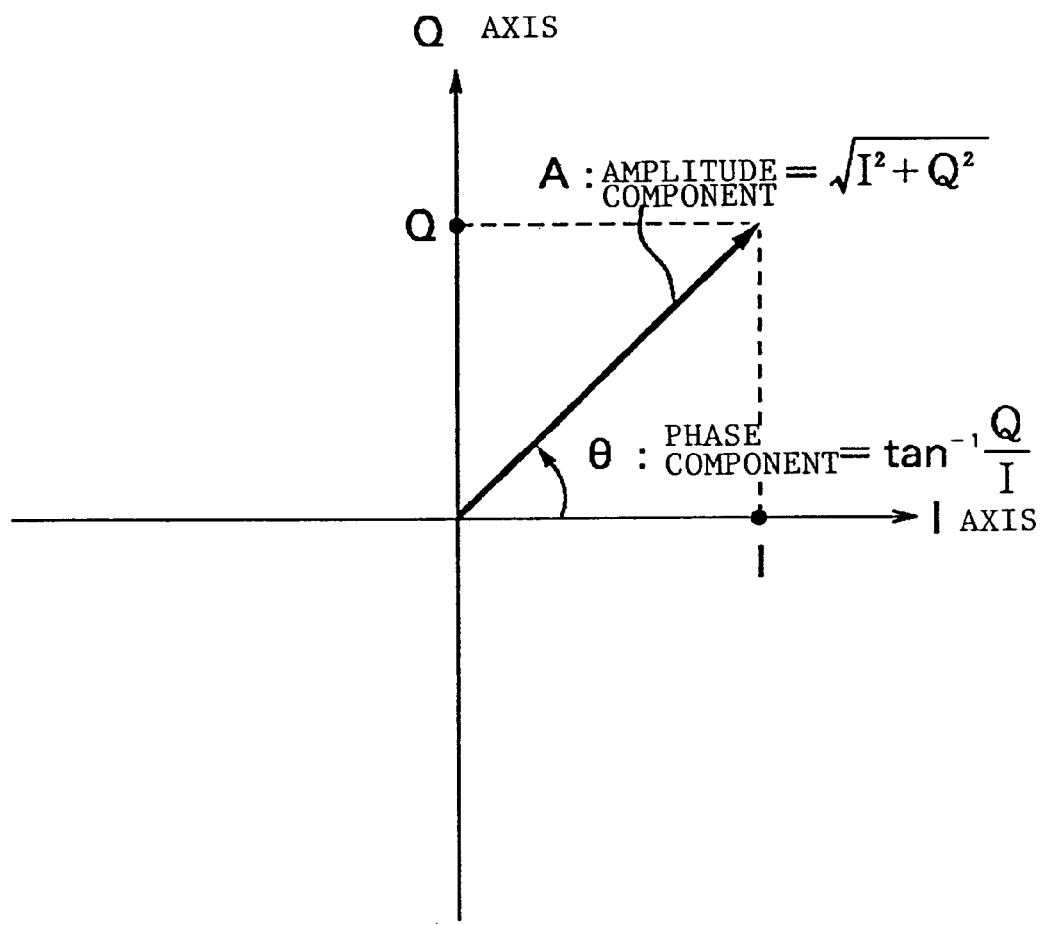
FIG. 20 is a diagrammatic view illustrating operation of a polar coordinate transformation circuit shown in FIG. 17.

I information 106 and Q information 107 outputted from FIR digital filters 104 and 105 described above are inputted, as seen in FIG. 17, to polar coordinate transformation circuit 108, by which they are converted into amplitude information A(t) and phase information θ(t). The relationship of I information 106 and Q information 107 to amplitude information A(t) and phase information θ(t) is such as illustrated in FIG. 20.

Referring back to FIG. 17, of amplitude information A(t) and phase information θ(t) extracted from polar coordinate transformation circuit 108, amplitude information A(t) is supplied to amplitude control circuit 115 while phase information θ(t) is supplied to phase modulator 111, by which a carrier inputted from carrier generator 112 is converted into a phase modulated wave by phase modulation with phase information θ(t). The phase modulated wave is supplied to D/A converter 113, by which it is converted into an analog signal. Then, unnecessary high frequency components are removed from the analog signal by low-pass filter (LPF) 114, and a resulting signal is supplied to power amplifier 116.

While power amplifier 116 power amplifies and outputs the phase modulated wave inputted thereto through LPF 114, the output amplitude level is controlled with the amplitude control signal inputted from amplitude control circuit 115 and corresponding to amplitude information A(t). Consequently, a signal produced by amplitude modulation of the phase modulated wave with the amplitude control signal, that is, a vestigial side band (VSB) signal, is outputted to output terminal 117. In this manner, a VSB signal can be obtained without using a vestigial side band filter.

Figure 21A:
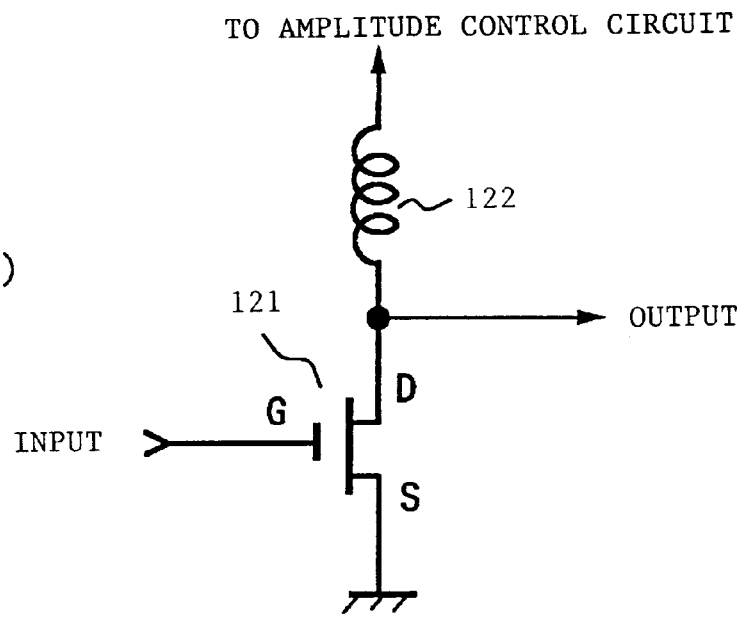
FIGS. 21(A) and 21(B) are circuit diagrams illustrating output level control methods of a power amplifier.

It is to be noted that, as an example of a method of controlling the amplitude level of power amplifier 116, there is a method wherein, as shown in FIG. 21(A), the drain of field effect transistor (FET) 121, which is an amplification element, is connected to an output terminal of amplitude control circuit 115 via coil 122 so that the drain voltage of FET 121 is controlled with an output voltage of amplitude control circuit 115 to vary the drain output voltage.

Figure 21B:
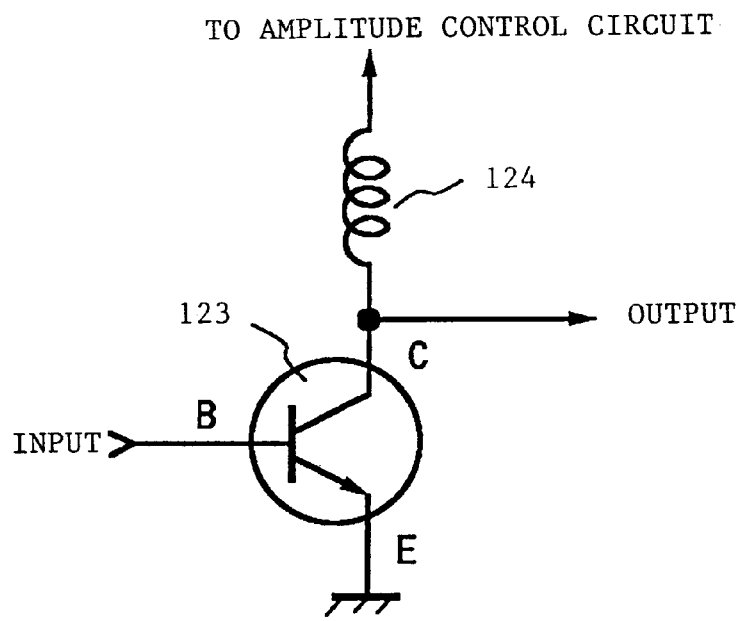

Meanwhile, FIG. 21(B) shows another example wherein, in place of FET 121, bipolar transistor (NPN transistor) 123 is used as an amplification element. In this example, the collector voltage of bipolar transistor 123 can be varied by controlling the same with an output voltage of amplitude control circuit 115 via coil 124.

Figure 22:
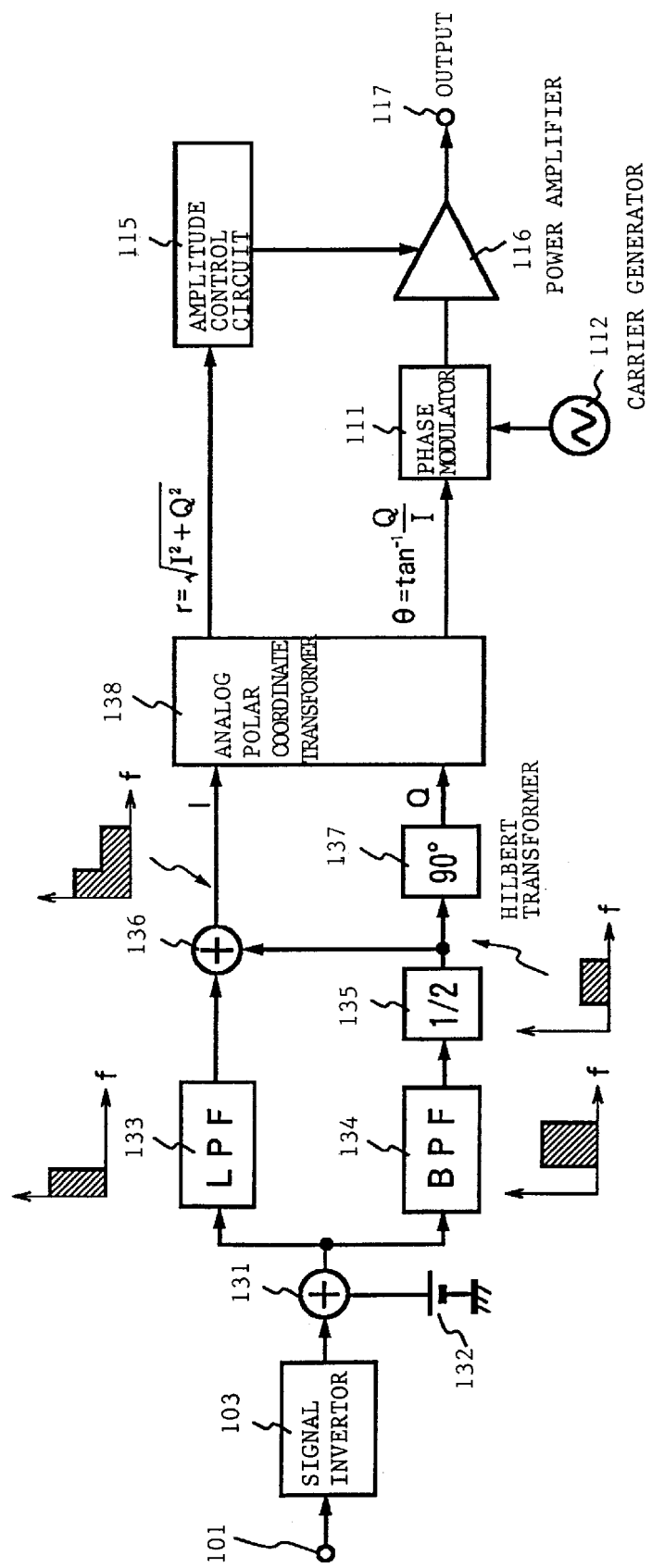
FIG. 22 is a block diagram of a fifth embodiment of the present invention.

Next, a fifth embodiment of the present invention is described. FIG. 22 shows a block diagram of a television broadcasting machine of the fifth embodiment of the present invention. In FIG. 22, same components as those of FIG. 17 are denoted by same reference symbols, and overlapping description thereof is omitted here. Referring to FIG. 22, an input analog signal inverted by signal invertor 103 is inputted to low-pass filter (LPF) 133 and band-pass filter (BPF) 134 after a dc voltage from dc voltage source 132 is added to it by adder 131.

LPF 133 passes therethrough only signal components (lower than 0.75 MHz) of a band which makes the DSB part of a VSB signal. Meanwhile, BPF 134 passes therethrough only signal components (0.75 MHz to 4.2 MHz) of another band which makes the SSB part of the VSB signal. An output signal of BPF 134 is reduced to ½ in amplitude by ½ attenuator 135 and then added to an output signal of LPF 133 by adder 136 to form I information. Meanwhile, the output of ½ attenuator 135 is supplied also to Hilbert transformer 137, by which it is phase shifted by 90 degrees to form Q information.

Figure 23:
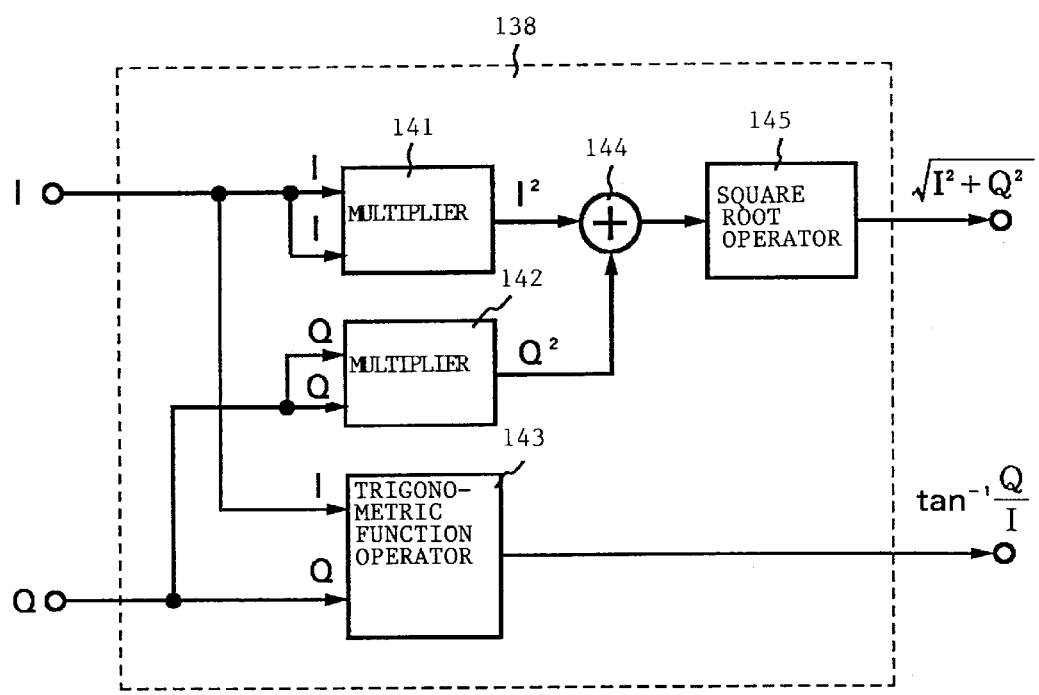
FIG. 23 is a block diagram of an example of an analog polar coordinate transformer shown in FIG. 22.

The I information and the Q information mentioned above are supplied to analog polar coordinate transformer 138, by which they are converted into amplitude information $r(=(I^2+Q^2)^{1/2})$ and phase information $\theta(=\tan^{-1}(Q/I))$. Here, analog polar coordinate transformer 138 is composed of, as seen in FIG. 23, multipliers 141 and 142, trigonometric function operator 143, adder 144 and square root operator 145. Referring to FIG. 23, a signal obtained by squaring input I information by multiplier 141 and another signal obtained by squaring input Q information by multiplier 142 are first added by adder 144 and then supplied to and square root operated by square root operator 145. Consequently, amplitude information r represented by $(I^2+Q^2)^{1/2}$ is outputted from square root operator 145.

Meanwhile, trigonometric function operator 143 receives the input I information and the input Q information, performs operation of $\tan^{-1}(Q/I)$ and outputs a result of the calculation as phase information $\theta$. Multipliers 141 and 142, trigonometric function operator 143 and square root operator 145 can be realized using a linear IC or a like device.

Of amplitude information r and phase information $\theta$ outputted from analog polar coordinate transformer 138, amplitude information r is supplied, similarly as in the fourth embodiment, to amplitude control circuit 115 while phase information $\theta$ is supplied to phase modulator 111, by which a carrier from carrier generator 112 is phase modulated with phase information $\theta$. The phase modulated wave from phase modulator 111 is supplied to power amplifier 116, by which it is amplitude modulated with a control signal from amplitude control circuit 115. Consequently, a VSB signal is obtained from power amplifier 116.

With the present embodiment, amplitude information and phase information can be detected from a video signal using an analog circuit, and a VSB signal can be obtained from the amplitude information and the phase information without using a vestigial side band filter.

As described above, according to the present invention, since a carrier is phase modulated and amplitude modulated with amplitude information and phase information obtained from an input video signal, a vestigial side band signal can be obtained without using vestigial side band. Consequently, a television broadcasting machine can be constructed at a reduced cost comparing with a conventional television broadcasting machine which employs a vestigial side band filter.

What is claimed is:

1. A digital amplitude modulation amplifier, comprising:
   an A/D converter for converting an analog modulation signal into a digital signal of a predetermined quantization bit number;
   a plural number of power amplifiers equal to the quantization bit number of the digital signal for C class operating with amplification degrees weighted for the individual bits;
   selectively inputting means for selectively inputting a carrier to said plural number of power amplifiers in accordance with values of the individual bits of the digital signal;
   coupling means for power composing, for all bits, output signals of those of said plural number of power amplifiers which are allocated to lower bits and output signals of those of said plural number of power amplifiers which are allocated to the other upper bits while controlling the phases of both of the output signals based on an external input phase control signal, further power composing, for all of the bits, the power composed signals while controlling the phases of the power composed signals based on the output signals of those of said power amplifiers which are allocated to the upper bits and the external input phase control signal and outputting an amplitude modulated wave from the last stage; and
   phase controlling means for receiving the digital signal as an input signal and generating and supplying the external input phase control signal to said coupling means.

2. A digital amplitude modulation amplifier as claimed in claim 1, further comprising same phase inputting means for adjusting the phases of an output signal of one of said plural number of power amplifiers and an output signal of another one of said plural number of power amplifiers or a power composed signal of output signals of another two of said plural number of power amplifiers on the lower bit side of the one power amplifier so that the two signals may have the same phase and inputting the two signals of the same phase to said coupling means.

3. A digital amplitude modulation amplifier as claimed in claim 1, wherein said coupling means comprises a plurality of couplers each comprising
   a first 3 dB coupler for power composing a signal inputted to a first input terminal thereof and an output signal of one of said plural number of power amplifiers inputted to a second input terminal thereof and outputting first and second signals, phase shifting means for controlling a phase difference between the first and second signals to a predetermined value based on an external input control signal, and
   a second 3 dB coupler having a dummy terminal and an output terminal for receiving the first and second signals after the phase difference therebetween has been controlled to the predetermined value by said phase shifting means as input signals, power composing the input signals and outputting a power composed signal from the output terminal, and
   an output signal of one of said plural number of power amplifiers corresponding to the least significant bit or an output signal from the output terminal of the second 3 dB coupler in the coupler of the bit of the preceding stage is inputted to said first terminal of said first 3 dB coupler while an amplitude modulated wave is outputted from said output terminal of the second 3 dB coupler in the coupler connected to said second input terminal to which an output signal of one of said plural number of power amplifiers corresponding to the most significant bit is inputted.

4. A digital amplitude modulation amplifier as claimed in claim 3, wherein said phase shifting means comprises first and second variable phase shifters for phase shifting the first and second signals outputted from said first 3 dB coupler independently of each other by phase shift amounts based on the external input control signal to produce signals of a same phase and outputting the signals of the same phase, and a phase shifter for phase shifting the first signal outputted from said first variable phase shifter by −90 degrees, and the second signal outputted from said second variable phase shifter and the first signal outputted from said phase shifter are inputted to said second 3 dB coupler.

5. A digital amplitude modulation amplifier as claimed in claim 1, wherein said selectively inputting means comprises a plurality of switches provided on an input side of and in a one-by-one corresponding relationship to said plural number of power amplifiers for individually outputting the input carrier to the corresponding power amplifiers only when said switches are on, and a controller for outputting a control signal for controlling said plurality of switches to on or off states independently of each other in accordance with values of individual bits of a digital signal.

6. A digital amplitude modulation amplifier as claimed in claim 1, wherein said phase control means receive a digital signal as an address, generates an external input phase control signal indicative of a predetermined phase shift amount in response to the input address and supplying the external input phase control signal to said coupling means.

7. A digital amplitude modulation amplifier as claimed in claim 1, further comprising a D/A converter for converting, from within a digital signal divided into predetermined lower bits and upper bits in advance, the digital signal of the lower bits into an analog signal, an amplitude modulator for amplitude modulating a carrier with the output analog signal of said D/A converter, and a single A class or AB class power amplifier provided in place of the one, or two or more C class amplifiers of said plural number of power amplifiers which are allocated to the lower bits, and an output signal of said A class or AB class power amplifier is inputted to said coupling means while the digital signal of the upper bits is inputted to said selective inputting means.

8. A digital amplitude modulation amplifier as claimed in claim 1, wherein the carrier is phase modulated with a desired information signal.

9. A digital amplitude modulation amplifier as claimed in claim 2, wherein the carrier is phase modulated with a desired information signal.

10. A digital amplitude modulation amplifier as claimed in claim 3, wherein the carrier is phase modulated with a desired information signal.

11. A digital amplitude modulation amplifier as claimed in claim 4, wherein the carrier is phase modulated with a desired information signal.

12. A digital amplitude modulation amplifier as claimed in claim 5, wherein the carrier is phase modulated with a desired information signal.

13. A digital amplitude modulation amplifier as claimed in claim 6, wherein the carrier is phase modulated with a desired information signal.

14. A digital amplitude modulation amplifier as claimed in claim 7, wherein the carrier is phase modulated with a desired information signal.

15. A digital amplitude modulation amplifier as claimed in claim 4, wherein said first and second variable phase shifters have a $\pi$ structure which comprises a transmission line of a predetermined length interposed in series in a signal line, and a plurality of series circuits connected in parallel between said signal line and a reference voltage at opposite ends of said transmission line and each comprising an impedance element and a switch element connected in series, and the plurality of switch elements are selectively switched on or off independently of each other by the external input phase control signal.

* * * * *